United States Patent
Huang et al.

(10) Patent No.: US 7,551,000 B2
(45) Date of Patent: Jun. 23, 2009

(54) DIFFERENTIAL BIDIRECTIONAL TRANSCEIVER AND RECEIVER THEREIN

(75) Inventors: Hong-Yi Huang, Taipei (TW); Ruei-Iun Pu, Taipei County (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 253 days.

(21) Appl. No.: 11/747,921

(22) Filed: May 14, 2007

(65) Prior Publication Data

US 2008/0116936 A1    May 22, 2008

(30) Foreign Application Priority Data

Nov. 22, 2006    (TW) ............................. 95143155 A

(51) Int. Cl.
*H03K 19/0185* (2006.01)
*H03K 19/094* (2006.01)

(52) U.S. Cl. .......................................... 326/83; 326/86

(58) Field of Classification Search ................... 326/82, 326/83, 86, 87; 327/108, 109
See application file for complete search history.

(56) References Cited

U.S. PATENT DOCUMENTS

| | | | | |
|---|---|---|---|---|
| 5,825,819 | A * | 10/1998 | Cogburn ...................... | 375/257 |
| 6,163,290 | A * | 12/2000 | Moreland et al. ........... | 341/155 |
| 7,078,935 | B2 * | 7/2006 | Choi ............................ | 326/82 |

\* cited by examiner

*Primary Examiner*—Daniel D Chang
(74) *Attorney, Agent, or Firm*—Jianq Chyun IP Office

(57) ABSTRACT

A differential bidirectional transceiver is provided. The differential bidirectional transceiver includes a first current transmitter, a second current transmitter and a receiver. The first current transmitter and the second current transmitter are coupled to a first interconnection and a second interconnection, respectively. Each of the current transmitters includes two current sources and two switches. The receiver includes an input circuit consisting of four differential pairs, a current summation circuit and a buffer.

33 Claims, 17 Drawing Sheets

| | T1 | T2 | W1 | W2 | $V_{P1}$ | $V_{N1}$ | $V_{P2}$ | $V_{N2}$ | O1 | O2 |
|---|---|---|---|---|---|---|---|---|---|---|
| Case1 | 1 | 1 | $V_L$ | $V_L$ | $V_{DD}$ | $V_L$ | $V_{DD}$ | $V_L$ | 1 | 1 |
| Case2 | 1 | 0 | $V_{1-0}$ | $V_{0-1}$ | $V_H$ | $>V_L$ | $<V_H$ | $V_L$ | 1 | 0 |
| Case3 | 0 | 1 | $V_{0-1}$ | $V_{1-0}$ | $<V_H$ | $V_L$ | $V_H$ | $>V_L$ | 0 | 1 |
| Case4 | 0 | 0 | $V_H$ | $V_H$ | $V_H$ | GND | $V_H$ | GND | 0 | 0 |

FIG. 3B

|  | T1 | T2 | $V_{W2}$ | $V_{W4}$ | $V_{P2}$ | $V_{N2}$ | $V_{P4}$ | $V_{N4}$ |
|---|---|---|---|---|---|---|---|---|
| Case1 | 1 | 1 | $V_L$ | $V_L$ | $V_{DD}$ | $V_L$ | $V_{DD}$ | $V_L$ |
| Case2 | 1 | 0 | $V_{1-0}$ | $V_{0-1}$ | $V_H$ | $>V_L$ | $<V_H$ | $V_L$ |
| Case3 | 0 | 1 | $V_{0-1}$ | $V_{1-0}$ | $<V_H$ | $V_L$ | $V_H$ | $>V_L$ |
| Case4 | 0 | 0 | $V_H$ | $V_H$ | $V_H$ | GND | $V_H$ | GND |

|  | /T1 | /T2 | $V_{W1}$ | $V_{W3}$ | $V_{P1}$ | $V_{N1}$ | $V_{P3}$ | $V_{N3}$ |
|---|---|---|---|---|---|---|---|---|
| Case1 | 0 | 0 | $V_H$ | $V_H$ | GND | $V_H$ | GND | $V_H$ |
| Case2 | 0 | 1 | $V_{0-1}$ | $V_{1-0}$ | $V_L$ | $<V_H$ | $>V_L$ | $V_H$ |
| Case3 | 1 | 0 | $V_{1-0}$ | $V_{0-1}$ | $>V_L$ | $V_H$ | $V_L$ | $<V_H$ |
| Case4 | 1 | 1 | $V_L$ | $V_L$ | $V_L$ | $V_{DD}$ | $V_L$ | $V_{DD}$ |

FIG. 10B

| | $r_{out}$ | $gm_{total}$ | $i_{out}$ |
|---|---|---|---|
| STATE 1 [1,1] | $[gm_{P8} \times r_{dsP8} \times (r_{dsP6} \| r_{dsN4})] \| [gm_{N8} \times r_{dsN8} \times (r_{dsN6} \| r_{dsP2})]$ | $gm_{N1} + gm_{P3}$ | $gm_{N1}(v_{P12}) - gm_{P3}(v_{W12}) < 0$ |
| STATE 2 [1,0] | $[gm_{P8} \times r_{dsP8} \times (r_{dsP6} \| r_{dsN4})] \| [gm_{N8} \times r_{dsN8} \times (r_{dsN6} \| r_{dsP2} \| r_{dsP4})]$ | $gm_{N1} + gm_{P3} + gm_{N3}$ | $gm_{N1}(v_{P12}) - (gm_{N3} + gm_{P3})(v_{W12}) > 0$ |
| STATE 3 [0,1] | $[gm_{P8} \times r_{dsP8} \times (r_{dsP6} \| r_{dsN4} \| r_{dsN1})] \| [gm_{N8} \times r_{dsN8} \times (r_{dsN6} \| r_{dsP2})]$ | $gm_{P1} + gm_{P3} + gm_{N3}$ | $(gm_{N3} + gm_{P3})v_{W12} - gm_{P1}(v_{N12}) < 0$ |
| STATE 4 [0,0] | $[gm_{P8} \times r_{dsP8} \times (r_{dsP6} \| r_{dsN2})] \| [gm_{N8} \times r_{dsN8} \times (r_{dsN6} \| r_{dsP4})]$ | $gm_{N3} + gm_{P1}$ | $gm_{N3}(v_{W12}) - gm_{P1}(v_{N12}) > 0$ |

DIFFERENTIAL BIDIRECTIONAL TRANSCEIVER AND RECEIVER THEREIN

CROSS-REFERENCE TO RELATED APPLICATION

This application claims the priority benefit of Taiwan application serial no. 95143155, filed Nov. 22, 2006. All disclosure of the Taiwan application is incorporated herein by reference.

BACKGROUND OF THE INVENTION

1. Field of the Invention

The present invention generally relates to an inter-chip or an intra-chip signal transceiver, and more particular, to a bidirectional transceiver having a differential signal transmission architecture.

2. Description of Related Art

The parasitic effects sparked by an interconnection on a chip for a very large scale integration (VLSI) would be dramatically increased with the steady progress of semiconductor process. Although the process progress is able to reduce both the width of an interconnection and the interval between interconnections, but the aspect ratio (ratio of height over width) of an interconnection must also be increased to prevent the parasitic impedance of the interconnection from significant increasing. As a whole however, the impedance of the interconnection still tends to increase as a result. Besides, as the interval between interconnections gets narrower, the coupling capacitance and the side capacitance between interconnections are increased. Thus, the parasitic capacitance or the parasitic impedance between interconnections would be increased with the advancement of the semiconductor process.

Using interconnections made of copper instead of aluminum and using a material with lower dielectric coefficient to fabricate interconnections are good solutions to reduce the parasitic effects. In addition, by inserting a buffer to delay the signal transmission on an interconnection is considered as a proper solution which is also a common design practice for an integration circuit (IC); reducing the voltage swing on an interconnection is helpful to lower the signal transmission delay and power consumption although the scheme of reducing the swing would accordingly decrease the signal driving capacity. In short, most of the circuit architectures with a lower swing fail to be operated in high frequency, which results in a slower data transmission rate.

In order to double the speed of data transmission, bidirectional signal transceiver architecture is usually preferred to transmit signals. The proposed bidirectional signal transceiver architecture on a chip is classified into two kinds: a switch-in-drain circuit architecture and a switch-in-gate circuit architectures, which are shown by FIGS. 1 and 2, respectively.

FIG. 1 is a schematic view of a switch-in-drain bidirectional signal transceiver architecture, while FIG. 2 is a schematic view of a switch-in-gate bidirectional signal transceiver architecture. In FIGS. 1 and 2, T1 and T2 represent input voltage signals, /T1 and /T2 respectively represent the inverting signals of the input voltage signals T1 and T2, O1 and O2 represent output signals, 150 represents interconnection and R represents interconnection resistance.

Since the circuit operation principle of FIG. 2 is much similar to that of FIG. 1, only the circuit operation of FIG. 1 is described hereinafter. Referring to FIG. 1, in mode for current to transmit signal, the signals of both side circuits are transmitted to one another (herein both side circuits refer to the left side circuit and the right side circuit of the interconnection 150). The transmitting terminal 110 of the left side circuit includes a set of switches 111 and 112 and a set of current sources 113 and 114, while the transmitting terminal 120 of the right side circuit includes a set of switches 121 and 122 and a set of current sources 123 and 124. By using input voltage signals to control the above-mentioned switches, the current on the interconnection 150 is varied. In the receiving terminals 130 and 140 of FIG. 1, the operations are mainly based on the scheme that replicating the current produced at the opposite transmitting terminal and then converting the current signal to a voltage signal through the technique of converting current into voltage.

The ideal signal waveforms of the two circuit architectures of FIGS. 1 and 2 are shown by FIG. 3A. In FIG. 3A, the solid line represents the voltage variation at the node W1 in FIGS. 1 and 2, while the broken line represents the voltage variation at the node W2. The operation voltage variations at the different locations of the two circuits are illustrated in FIG. 3B where the bias voltages at the different locations in the circuits of FIGS. 1 and 2 corresponding to four ideal input voltage states are listed in a table. In the table, $V_L = V_{tn}$, and $V_H = V_{DD} - |V_{tp}|$, wherein $V_{tn}$ represents the threshold voltage of an N-type metal oxide semiconductor transistor (NMOS transistor), while $V_{tp}$ represents the threshold voltage of a P-type metal oxide semiconductor transistor (PMOS transistor).

Although the above-mentioned circuits have in the advantages of simpler architecture, but the disadvantages caused by the shortage thereof can not be ignored, because both the circuit architectures need inverters (such as 160 and 170 in FIGS. 1 and 2) to judge whether the voltages of the nodes W1 and W2 take a voltage level $V_{1-0}$ or a voltage $V_{0-1}$ level. Thus, the threshold voltage of the inverter must be specified between $V_{0-1}$ and $V_{1-0}$ by design, which requires both difference values between the threshold voltage and $V_{0-1}/V_{1-0}$ must be sufficient large for the inverter to detect the voltage levels, and accordingly lengthens the charge/discharge time of the nodes W1 and W2. As a result, the signal transmission rate is limited. On the other hand, both the two circuit architectures tend to be affected by the process (for example, affected by any electrical characteristic drift of a component), in particular, by a noise in the case where the interconnection 150 is quite long.

In more detail, the switch-in-drain circuit architecture can be classified into two kinds: a circuit architecture using diode-connected-current-sources as shown by FIG. 1 and a circuit architecture using self-bias-current-sources as shown by FIG. 4; The switch-in-gate circuit architecture can be classified into three kinds: a circuit architecture using diode-connected-current-sources as shown by FIG. 5, a circuit architecture of current-source gate-bias in ½ $V_{DD}$ which means the bias voltage of the current sources are set at ½ $V_{DD}$ as shown by FIG. 6 and a circuit architecture using terminator resistors for reducing the voltage swing as shown by FIG. 7. It is obvious that all the above-mentioned circuit architectures have the same problems, that is to say the signal transmission rate would be seriously reduced once the interconnection length is increased.

SUMMARY OF THE INVENTION

The present invention provides a differential bidirectional transceiver connected to a first interconnection and a second interconnection, wherein the differential transceiver includes a first current transmitter, a second current transmitter and a receiver.

The first current transmitter is coupled to the first interconnection, and the node of the first current transmitter and the first interconnection receives a first wire voltage signal. The first current transmitter includes first current sources, first switches, second current sources and second switches. The first current source has a current terminal with a first internal voltage signal. The first switch is coupled to the first current source and the first interconnection to receive an inverted input voltage signal and allow the current provided by the first current source to flow to the first interconnection according to the inverted input voltage signal. Similarly, the second current source has a current terminal with a second internal voltage signal. The second switch is coupled to the second current source and the first interconnection to receive the inverted input voltage signal and allow the current provided by the second current source to flow from the first interconnection according to the inverted input voltage signal.

The second current transmitter is coupled to the second interconnection, and the node of the second current transmitter and the second interconnection receive a second wire voltage signal. The second current transmitter includes third current sources, third switches, fourth current sources and fourth switches. The third current source has a current terminal with a third internal voltage signal. The third switch is coupled to the third current source and the second interconnection to receive the input voltage signal and allow the current provided by the third current source to flow to the second interconnection according to the input voltage signal. Similarly, the fourth current source has a current terminal with a fourth internal voltage signal. The fourth switch is coupled to the fourth current source and the second interconnection to receive the input voltage signal and allow the current provided by the fourth current source to flow from the second interconnection according to the input voltage signal.

The receiver includes an input circuit, a current summation circuit and a buffer, wherein the input circuit includes a first differential pair, a second differential pair, a third differential pair and a fourth differential pair. The first differential pair is employed for comparing the second internal voltage signal with the fourth internal voltage signal, the second differential pair is employed for comparing the first wire voltage signal with the second wire voltage signal, the third differential pair is employed for comparing the first internal voltage signal with the third internal voltage signal and the fourth differential pair is employed for comparing the first wire voltage signal with the second wire voltage signal. The current summation circuit is coupled to the input circuit for summing up the current outputs from the differential pairs and obtaining a small-signal output voltage signal according to the comparison results of the differential pairs. The buffer is coupled to the current summation circuit for adjusting the small-signal output voltage signal of the current summation circuit.

BRIEF DESCRIPTION OF THE DRAWINGS

The accompanying views are included to provide a further understanding of the invention, and are incorporated in and constitute a part of this specification. The views illustrate embodiments of the invention and, together with the description, serve to explain the principles of the invention.

FIG. 3B is a table showing the bias voltages at the different locations in the circuits of FIGS. 1 and 2 corresponding to four ideal input voltage states.

FIG. 10B is a table showing the bias voltages at the different locations in the circuits of FIG. 9 corresponding to four ideal input voltage states.

FIG. 14 is a table for calculating the output resistance $r_{out}$, the total transconductance $gm_{total}$ and the output current $i_{out}$ corresponding to four ideal states of the input voltage signals T1 and T2.

DESCRIPTION OF THE EMBODIMENTS

Figure 8:
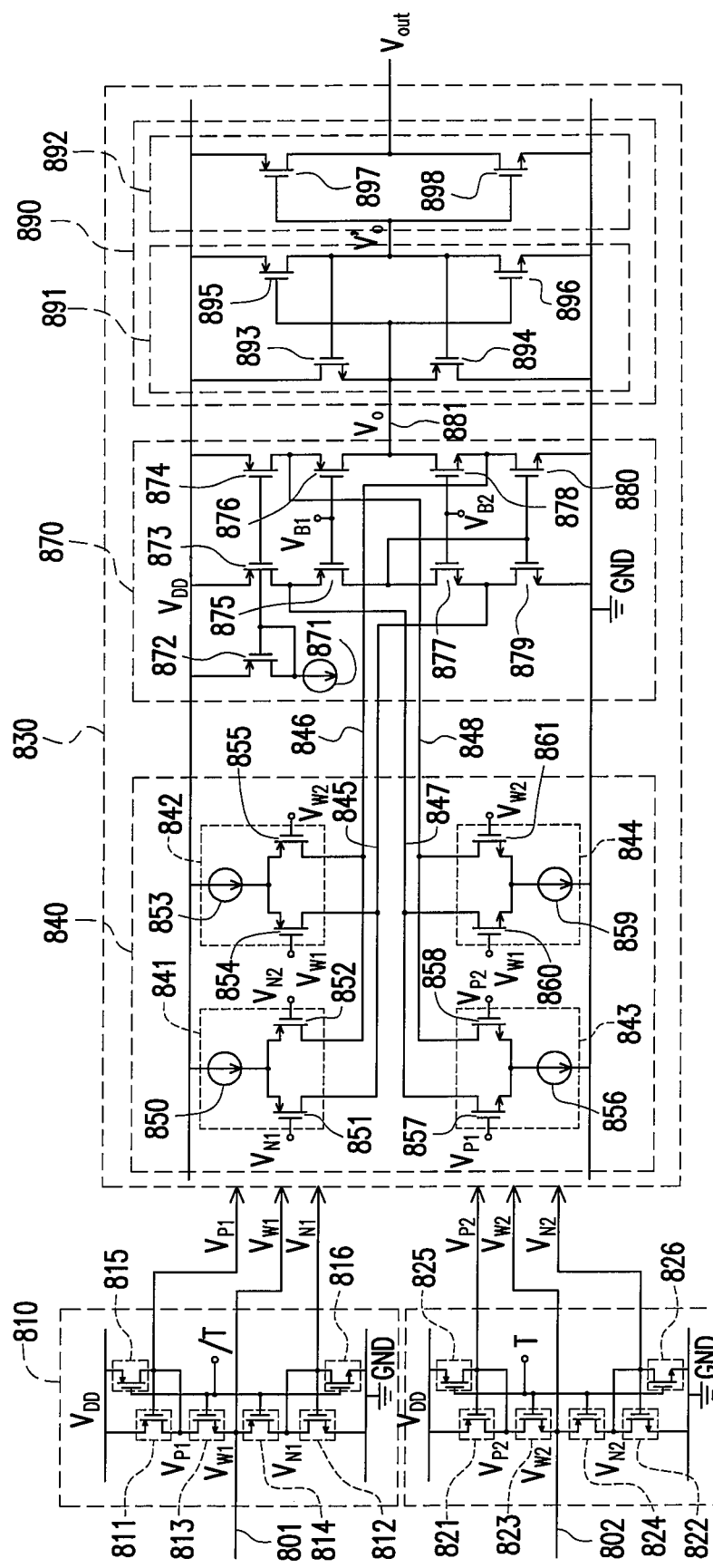
FIG. 8 is a schematic circuit diagram of a differential bidirectional transceiver according to an embodiment of the present invention.

FIG. 8 is a schematic circuit diagram of a differential bidirectional transceiver according to an embodiment of the present invention. For convenience, the wiring relationship between the circuit components and the brief operation principle are introduced in association with the accompanying FIG. 8 herein. Referring to FIG. 8, a differential bidirectional transceiver is connected to interconnections 801 and 802. The differential bidirectional transceiver includes a first current transmitter 810, a second current transmitter 820 and a receiver 830.

The first current transmitter 810 is coupled to the interconnection 801, wherein the node of the first current transmitter 810 and the interconnection 801 receives a wiring voltage signal $V_{W1}$. The first current transmitter 810 includes current sources 811 and 812 and switches 813, 814, 815 and 816.

The current source 811 has a current terminal with an internal voltage signal $V_{P1}$. The switch 813 is coupled to the current source 811 and the interconnection 801 for receiving the inverting signal /T of an input voltage signal T and allowing the current provided by the current source 811 to flow into the interconnection 801 according to the inverting signal /T of the input voltage signal T. Similarly, the current source 812 has a current terminal with an internal voltage signal $V_{N1}$. The switch 814 is coupled to the current source 812 and the interconnection 801 for receiving the inverting signal /T of the input voltage signal T and allowing the current provided by the current source 812 to flow from the interconnection 801 according to the inverting signal /T of the input voltage signal T. The switch 815 is coupled between the current terminal of the current source 811 and the power voltage $V_{DD}$ and is turned on/off according to the inverting signal /T of the input voltage signal T. The switch 816 is coupled between the current terminal of the current source 812 and a common voltage level GND and is turned on/off according to the inverting signal /T of the input voltage signal T.

In the embodiment, the current source 811 is implemented by a PMOS transistor, wherein the source of the PMOS transistor is coupled to the power voltage $V_{DD}$ and the drain thereof serves as the current terminal of the current source 811 and coupled to the gate of the PMOS transistor. The switch 813 is implemented by an NMOS transistor, wherein the drain of the NMOS transistor is coupled to the current terminal of the current source 811, the source thereof is coupled to the interconnection 801 and the gate thereof receives the inverting signal /T of the input voltage signal T to control on/off states of the switch 813.

The current source 812 is implemented by an NMOS transistor, wherein the source of the NMOS transistor is coupled to the common voltage level GND and the drain thereof serves as the current terminal of the current source 812 and coupled to the gate of the NMOS transistor. The switch 814 is implemented by a PMOS transistor, wherein the drain of the PMOS transistor is coupled to the current terminal of the current source 812, the source thereof is coupled to the interconnection 801 and the gate thereof receives the inverting signal /T of the input voltage signal T to control on/off states of the switch 814.

The switch 815 is implemented by a PMOS transistor, wherein the source of the PMOS transistor is coupled to the power voltage $V_{DD}$, the drain thereof is coupled to the current terminal of the current source 811 and the gate of the PMOS transistor receives the inverting signal /T of the input voltage signal T to control on/off states of the switch 815. The switch 816 is implemented by an NMOS transistor, wherein the source of the NMOS transistor is coupled to the common voltage level GND, the drain thereof is coupled to the current terminal of the current source 812 and the gate thereof receives the inverting signal /T of the input voltage signal T to control on/off states of the switch 816.

The second current transmitter 820 is coupled to the interconnection 802, wherein the node of the second current transmitter 820 and the interconnection 802 receive a wiring voltage signal $V_{W2}$. The second current transmitter 820 includes current sources 821 and 822 and switches 823, 824, 825 and 826.

The current source 821 has a current terminal with an internal voltage signal $V_{P2}$. The switch 823 is coupled to the current source 821 and the interconnection 802 for receiving the input voltage signal T and allowing the current provided by the current source 821 to flow into the interconnection 802 according to the input voltage signal T. Similarly, the current source 822 has a current terminal with an internal voltage signal $V_{N2}$. The switch 824 is coupled to the current source 822 and the interconnection 802 for receiving the input voltage signal T and allowing the current provided by the current source 822 to flow from the interconnection 802 according to the input voltage signal T. The switch 825 is coupled between the current terminal of the current source 821 and the power voltage $V_{DD}$ and is turned on/off according to the input voltage signal T. The switch 826 is coupled between the current terminal of the current source 822 and a common voltage level GND and is turned on/off according to the input voltage signal T.

In the embodiment, the current source 821 is implemented by a PMOS transistor, wherein the source of the PMOS transistor is coupled to the power voltage $V_{DD}$ and the drain thereof serves as the current terminal of the current source 821 and coupled to the gate of the PMOS transistor. The switch 823 is implemented by an NMOS transistor, wherein the drain of the NMOS transistor is coupled to the current terminal of the current source 821, the source thereof is coupled to the interconnection 802 and the gate thereof receives the input voltage signal T to control on/off states of the switch 823.

The current source 822 is implemented by an NMOS transistor, wherein the source of the NMOS transistor is coupled to the common voltage level GND and the drain thereof serves as the current terminal of the current source 822 and coupled to the gate of the NMOS transistor. The switch 824 is implemented by a PMOS transistor, wherein the drain of the PMOS transistor is coupled to the current terminal of the current source 822, the source thereof is coupled to the interconnection 802 and the gate thereof receives the input voltage signal T to control on/off states of the switch 824.

The switch 825 is implemented by a PMOS transistor, wherein the source of the PMOS transistor is coupled to the power voltage $V_{DD}$, the drain thereof is coupled to the current terminal of the current source 821 and the gate of the PMOS transistor receives the input voltage signal T to control on/off states of the switch 825. The switch 826 is implemented by an NMOS transistor, wherein the source of the NMOS transistor is coupled to the common voltage level GND, the drain thereof is coupled to the current terminal of the current source 822 and the gate thereof receives the input voltage signal T to control on/off states of the switch 826.

The receiver 830 includes an input circuit 840, a current summation circuit 870 and a buffer 890, wherein the input circuit 840 includes differential pairs 841, 842, 843 and 844. The differential pair 841 is employed for comparing the internal voltage signal $V_{N1}$ with the internal voltage signal $V_{N2}$, the differential pair 842 is employed for comparing the wire voltage signal $V_{W1}$ with the wire voltage signal $V_{W2}$, the differential pair 843 is employed for comparing the internal voltage signal $V_{P1}$ with the internal voltage signal $V_{P2}$ and the differential pair 844 is employed for comparing the wire voltage signal $V_{W1}$ with the wire voltage signal $V_{W2}$. The current summation circuit 870 is coupled to the input circuit 840 for summing up the current outputs from the above-mentioned differential pairs and obtaining a small-signal output voltage signal $V_o$ according to the comparison results of the differential pairs. The buffer 890 is coupled to the current summation circuit 870 for adjusting the small-signal output voltage signal $V_o$ of the current summation circuit 870.

In the embodiment, the differential pair 841 includes a current source 850, PMOS transistors 851 and 852. The current source 850 has a first terminal and a second terminal and the first terminal of the current source 850 is coupled to the power voltage $V_{DD}$. The source of the PMOS transistor 851 is coupled to the second terminal of the current source 850, the drain thereof is coupled to the current output terminal 845 of the input circuit 840 and the gate thereof receives the internal voltage signal $V_{N1}$. The source of the PMOS transistor 852 is coupled to the second terminal of the current source 850, the drain thereof is coupled to the current output terminal 846 of the input circuit 840 and the gate thereof receives the internal voltage signal $V_{N2}$.

The differential pair 842 includes a current source 853, a PMOS transistor 854 and a PMOS transistor 855. The current source 853 has a first terminal and a second terminal and the first terminal of the current source 853 is coupled to the power voltage $V_{DD}$. The source of the PMOS transistor 854 is coupled to the second terminal of the current source 853, the drain thereof is coupled to the current output terminal 845 and the gate thereof receives the wire voltage signal $V_{W1}$. The source of the PMOS transistor 855 is coupled to the second terminal of the current source 853, the drain thereof is coupled to the current output terminal 846 and the gate thereof receives the wire voltage signal $V_{W2}$.

The differential pair 843 includes a current source 856, an NMOS transistor 857 and an NMOS transistor 858. The current source 856 has a first terminal and a second terminal and the first terminal of the current source 856 is coupled to a common voltage level GND. The source of the NMOS transistor 857 is coupled to the second terminal of the current source 856, the drain thereof is coupled to the current output terminal 847 of the input circuit 840 and the gate thereof receives the internal voltage signal $V_{P1}$. The source of the NMOS transistor 858 is coupled to the second terminal of the current source 856, the drain thereof is coupled to the current output terminal 848 of the input circuit 840 and the gate thereof receives the internal voltage signal $V_{P2}$. The current source 856 herein has the same rated output current as the above-mentioned current source 850.

The differential pair 844 includes a current source 859, an NMOS transistor 860 and an NMOS transistor 861. The current source 859 has a first terminal and a second terminal and the first terminal of the current source 859 is coupled to the common voltage level GND. The source of the NMOS transistor 860 is coupled to the second terminal of the current source 859, the drain thereof is coupled to the above-mentioned current output terminal 847 and the gate thereof receives the wire voltage signal $V_{W1}$. The source of the NMOS transistor 861 is coupled to the second terminal of the current source 859, the drain thereof is coupled to the above-mentioned current output terminal 848 and the gate thereof receives the wire voltage signal $V_{W2}$. The current source 859 herein has the same rated output current as the current source 853.

The current summation circuit 870 includes a current source 871, PMOS transistors 872, 873m 874, 875 and 876 and NMOS transistors 877, 878, 879 and 880. The source of the PMOS transistor 872 is coupled to the power voltage $V_{DD}$, while the drain thereof is coupled to the current source 871 and the gate of the PMOS transistor 872. The source of the PMOS transistor 873 is coupled to the power voltage $V_{DD}$, while the gate of the PMOS transistor 873 is coupled to the gate of the PMOS transistor 872. The source of the PMOS transistor 874 is coupled to the power voltage $V_{DD}$, while the gate of the PMOS transistor 874 is coupled to the gate of the PMOS transistor 873.

The source of the PMOS transistor 875 is coupled to the drain of the PMOS transistor 873 and the third current output terminal 847 of the input circuit 840, while the gate of the PMOS transistor 875 receives a bias voltage signal $V_{B1}$. The source of the PMOS transistor 876 is coupled to the drain of the PMOS transistor 874 and the current output terminal 848 of the input circuit 840, while the gate of the PMOS transistor 876 receives the bias voltage signal $V_{B1}$. The drain of the NMOS transistor 877 is coupled to the drain of the PMOS transistor 875, while the gate of the NMOS transistor 877 receives a bias voltage signal $V_{B2}$.

The drain of the NMOS transistor 878 is coupled to the drain of the PMOS transistor 876 for outputting the small-signal output voltage signal $V_o$, while the gate of the NMOS transistor 878 receives the bias voltage signal $V_{B2}$. The drain of the NMOS transistor 879 is coupled to the source of the NMOS transistor 877 and the current output terminal 845 of the input circuit 840, while the gate of the NMOS transistor 879 is coupled to the drain of the PMOS transistor 875 and the source of the NMOS transistor 879 is coupled to the common voltage level GND. The drain of the NMOS transistor 880 is coupled to the source of the NMOS transistor 878 and the current output terminal 846 of the input circuit 840, while the gate of the NMOS transistor 880 is coupled to the gate of the NMOS transistor 879 and the source of the NMOS transistor 880 is coupled to the common voltage level GND.

The above-mentioned buffer 890 includes a first buffer stage 891 and a second buffer stage 892. The first buffer stage 891 is coupled to an output terminal 881 of the current summation circuit 870, the output terminal 881 outputs the above-mentioned small-signal output voltage signal $V_o$ and the first buffer stage 891 is used for inverting the small-signal output voltage signal $V_o$ into the signal $V_{o'}$ and stabilizing the voltage at the output terminal 881 of the current summation circuit 870. The second buffer stage 892 is coupled to the first buffer stage 891 for inverting the output $V_{o'}$ of the first buffer stage.

The first buffer stage 891 includes NMOS transistors 893 and 896 and PMOS transistors 894 and 895. The drain of the NMOS transistor 893 is coupled to the power voltage $V_{DD}$, while the source thereof is coupled to the output terminal 881 of the current summation circuit 870. The drain of the PMOS transistor 894 is coupled to the common voltage level GND, while the source thereof is coupled to the output terminal 881 of the current summation circuit 870. The source of the PMOS transistor 895 is coupled to the power voltage $V_{DD}$, the drain thereof is coupled to the gate of the NMOS transistor 893 and the gate of the PMOS transistor 895 is coupled to the output terminal 881 of the current summation circuit 870. The source of the NMOS transistor 896 is coupled to the common voltage level GND, the drain of the NMOS transistor 896 is coupled to the gate of the PMOS transistor 894 and the drain of the PMOS transistor 895, and the gate of the NMOS transistor 896 is coupled to the output terminal 881 of the current summation circuit 870.

The second buffer stage 892 includes a PMOS transistor 897 and an NMOS transistor 898. The source of the PMOS transistor 897 is coupled to the power voltage $V_{DD}$, while the gate thereof is coupled to the drain of the PMOS transistor 895 and the drain of the NMOS transistor 896. The source of the NMOS transistor 898 is coupled to the common voltage level GND, the gate thereof is coupled to the gate of the PMOS transistor 897 and the drain of the NMOS transistor 898 is coupled to the drain of the PMOS transistor 897 for outputting the adjusted small-signal output voltage signal $V_{out}$.

Figure 9:
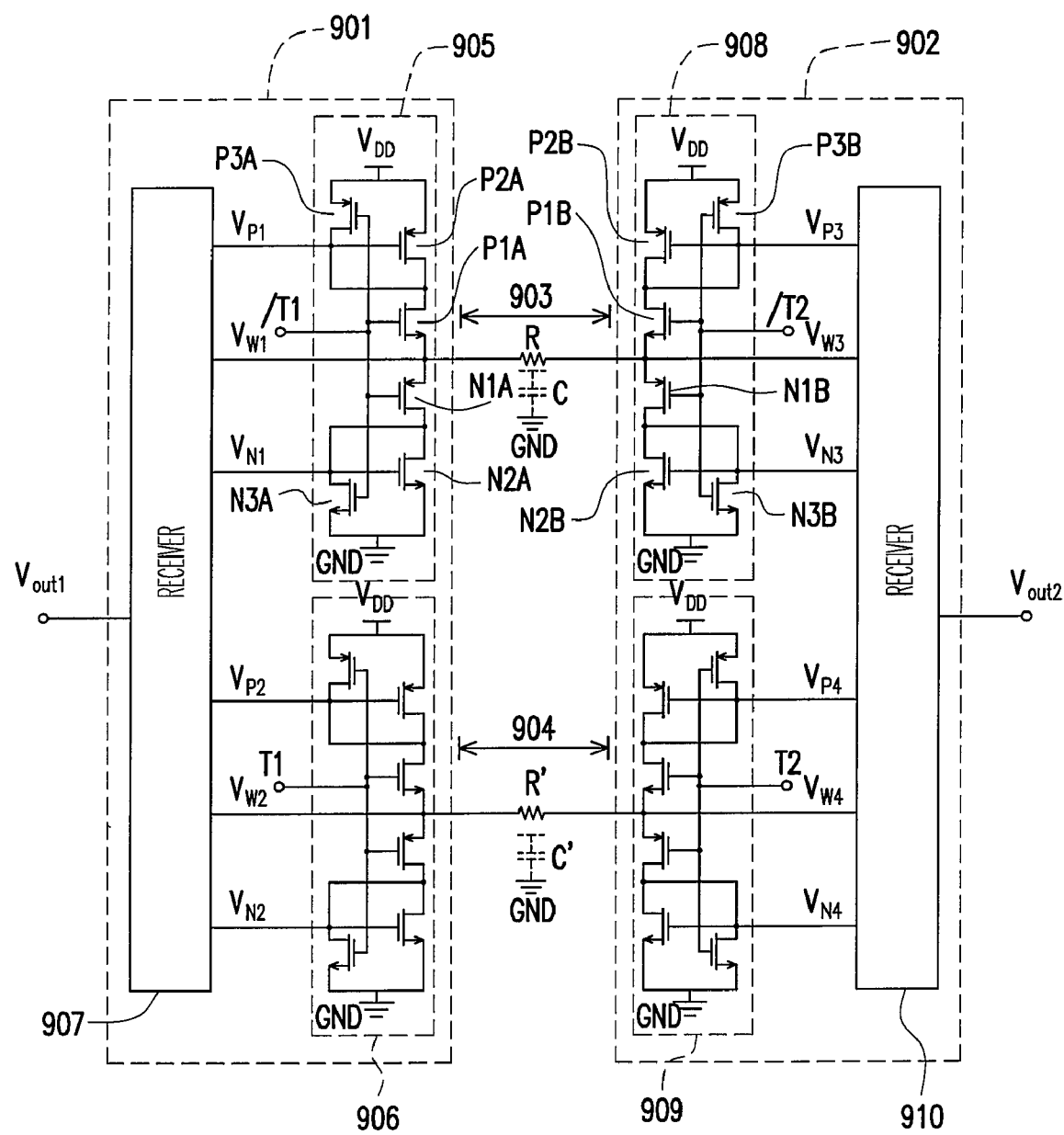
FIG. 9 is a circuit diagram showing two differential bidirectional transceivers are coupled to each other during operations.

FIG. 9 is a circuit diagram showing two differential bidirectional transceivers are coupled to each other during operations. The differential bidirectional transceivers 901 and 902 are connected to one another through interconnections 903 and 904. The differential bidirectional transceiver 901 includes a first current transmitter 905, a second current transmitter 906 and a receiver 907; the differential bidirectional transceiver 902 includes a first current transmitter 908, a second current transmitter 909 and a receiver 910. In FIG. 9, T1 and T2 represent input voltage signals, /T1 and /T2 respectively represent the inverting signals of the input voltage signals T1 and T2, wherein the input voltage signal T1 and the inverting signal /T1 thereof compose a pair of differential input voltage signals, while the input voltage signal T2 and the inverting signal /T2 thereof compose a pair of differential input voltage signals; $V_{out1}$ and $V_{out2}$ respectively represent the output signals of the differential bidirectional transceivers 901 and 902; R and R' respectively represent the resistances of the interconnections 903 and 904; C and C' respectively represent the coupling capacitances between the interconnection 903 and the common voltage level GND and between the interconnection 904 and the common voltage level GND. For depiction convenience, some of components in FIG. 9 are denoted in different marks from FIG. 8 (for example, a PMOS transistor and a NMOS transistor are denoted respectively in P3A and N3A, etc.).

Figure 1:
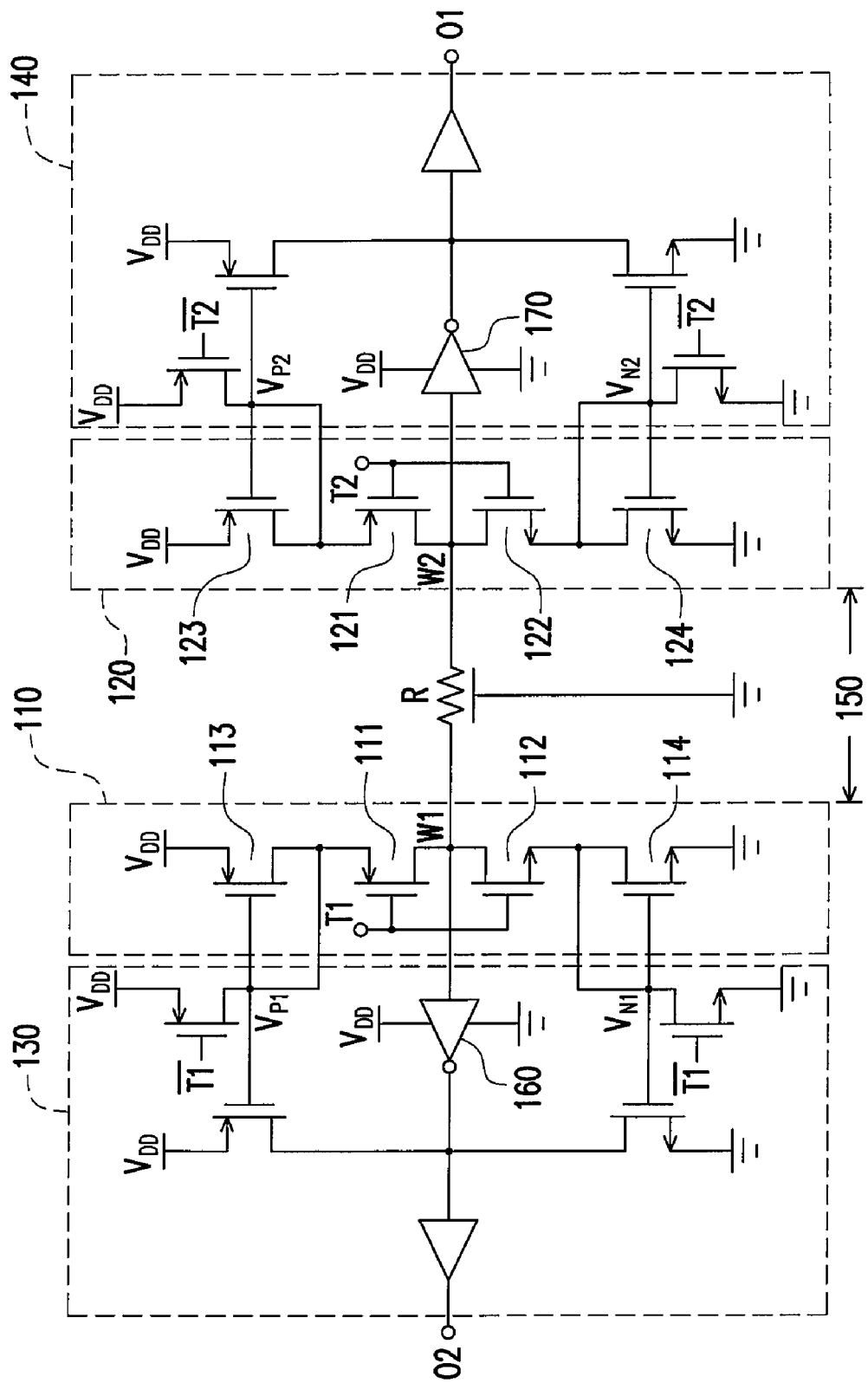
FIG. 1 is a schematic view of a switch-in-drain bidirectional signal transceiver architecture.
Figure 2:
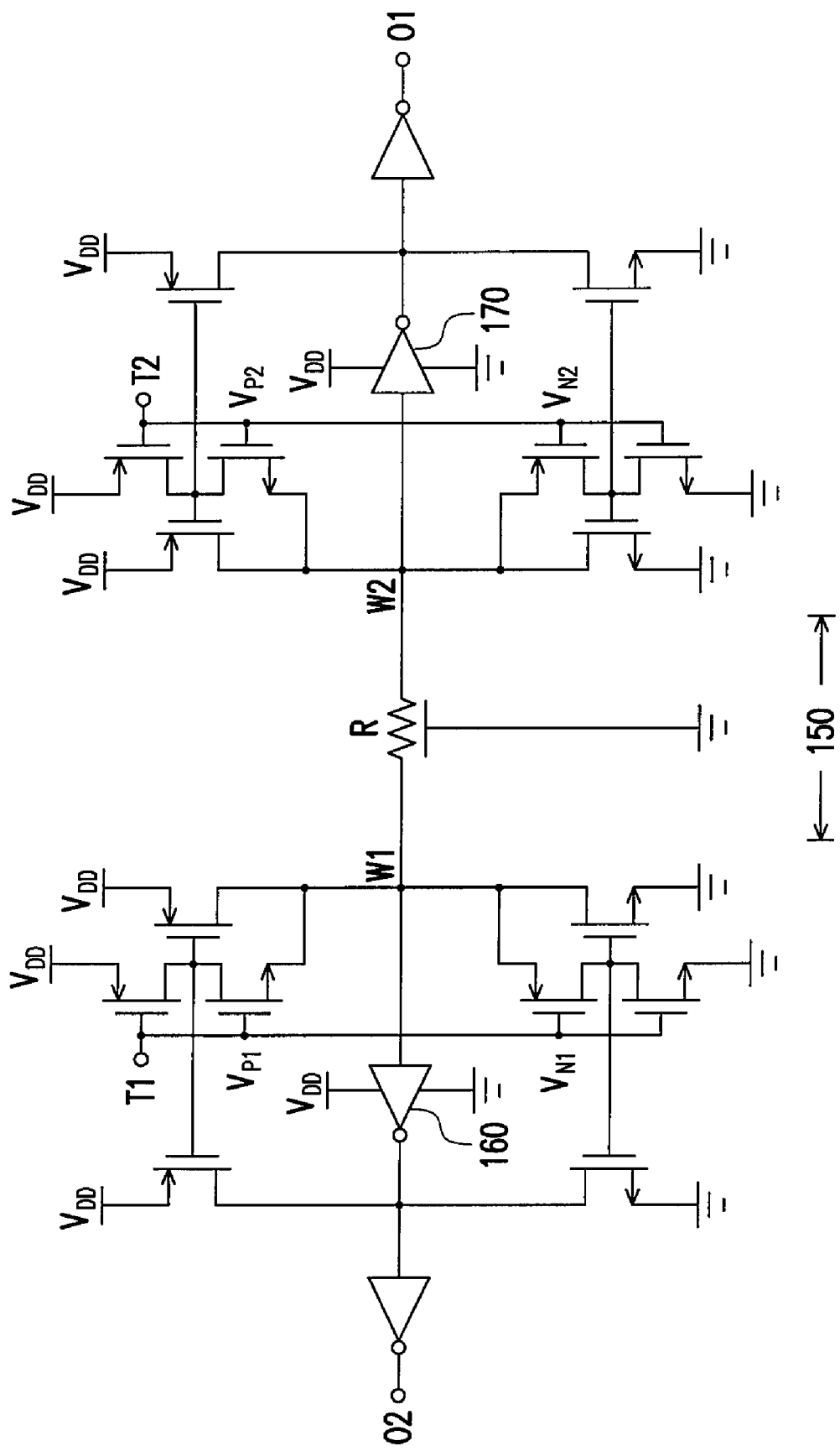
FIG. 2 is a schematic view of a switch-in-gate bidirectional signal transceiver architecture.
Figure 3A:
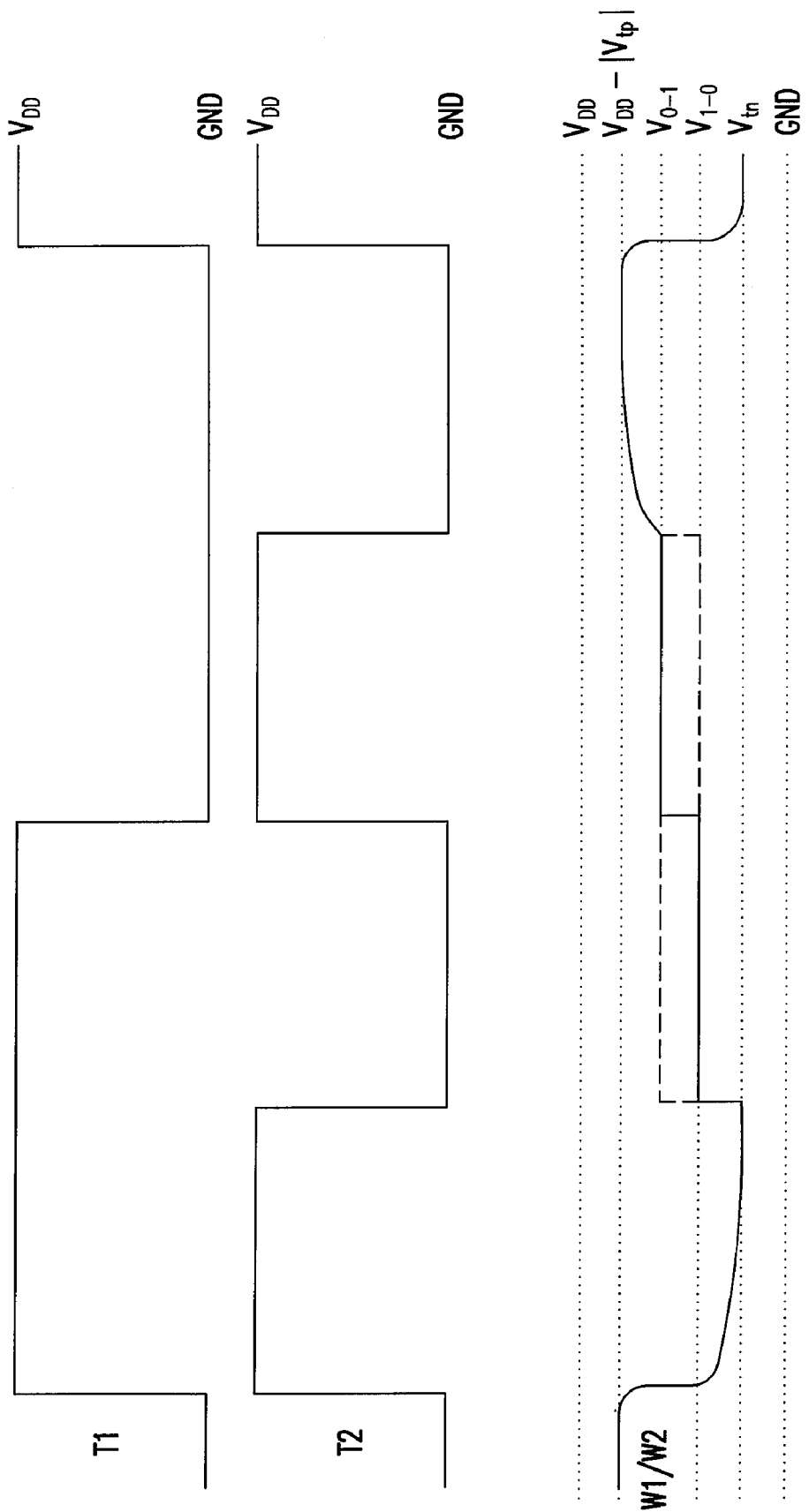
FIG. 3A is a diagram showing the ideal signal waveforms of the circuit architectures in FIGS. 1 and 2.
Figure 4:
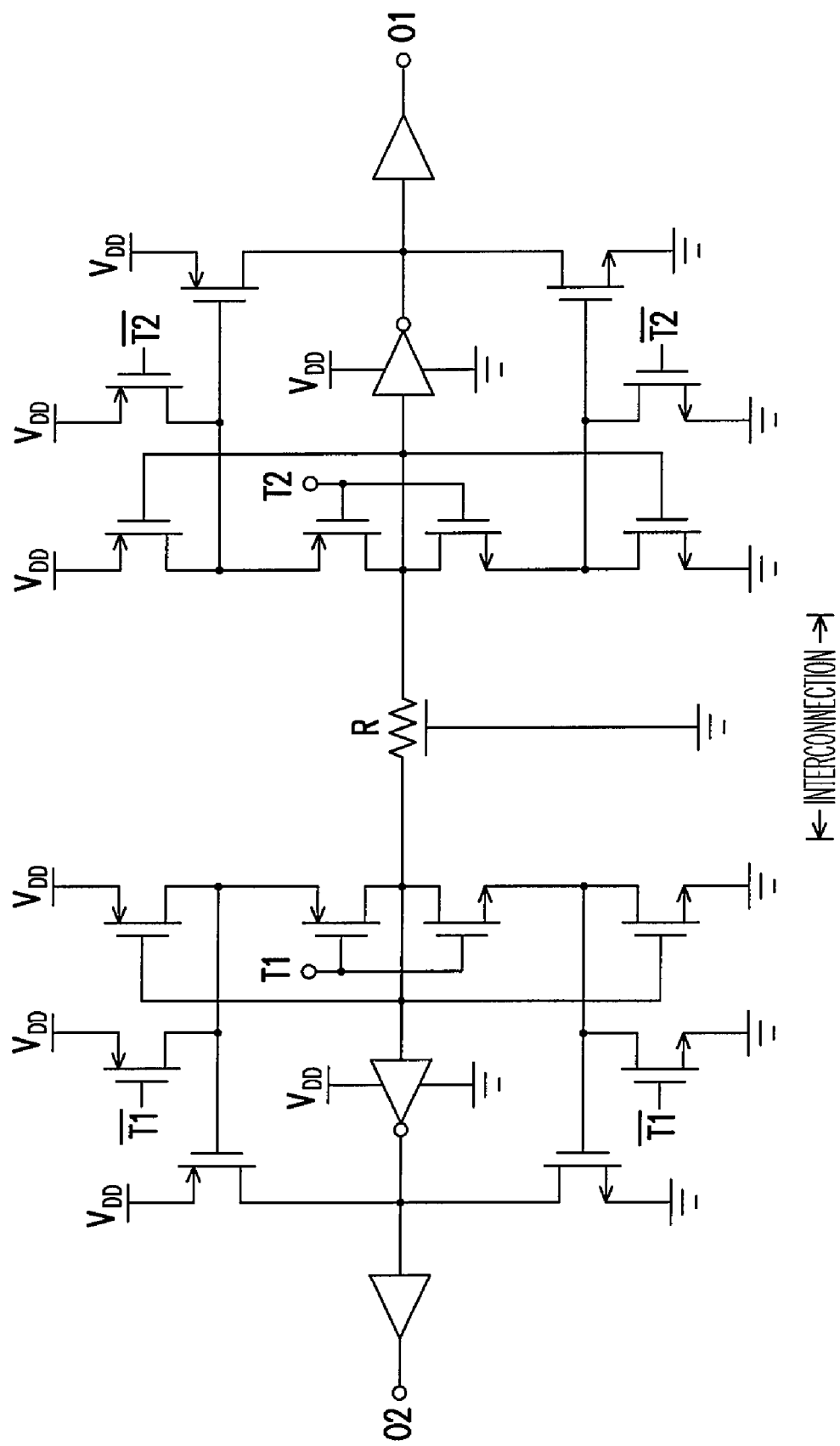
FIG. 4 is a schematic view of a switch-in-drain bidirectional signal transceiver architecture where self-bias-current-sources are employed.
Figure 5:
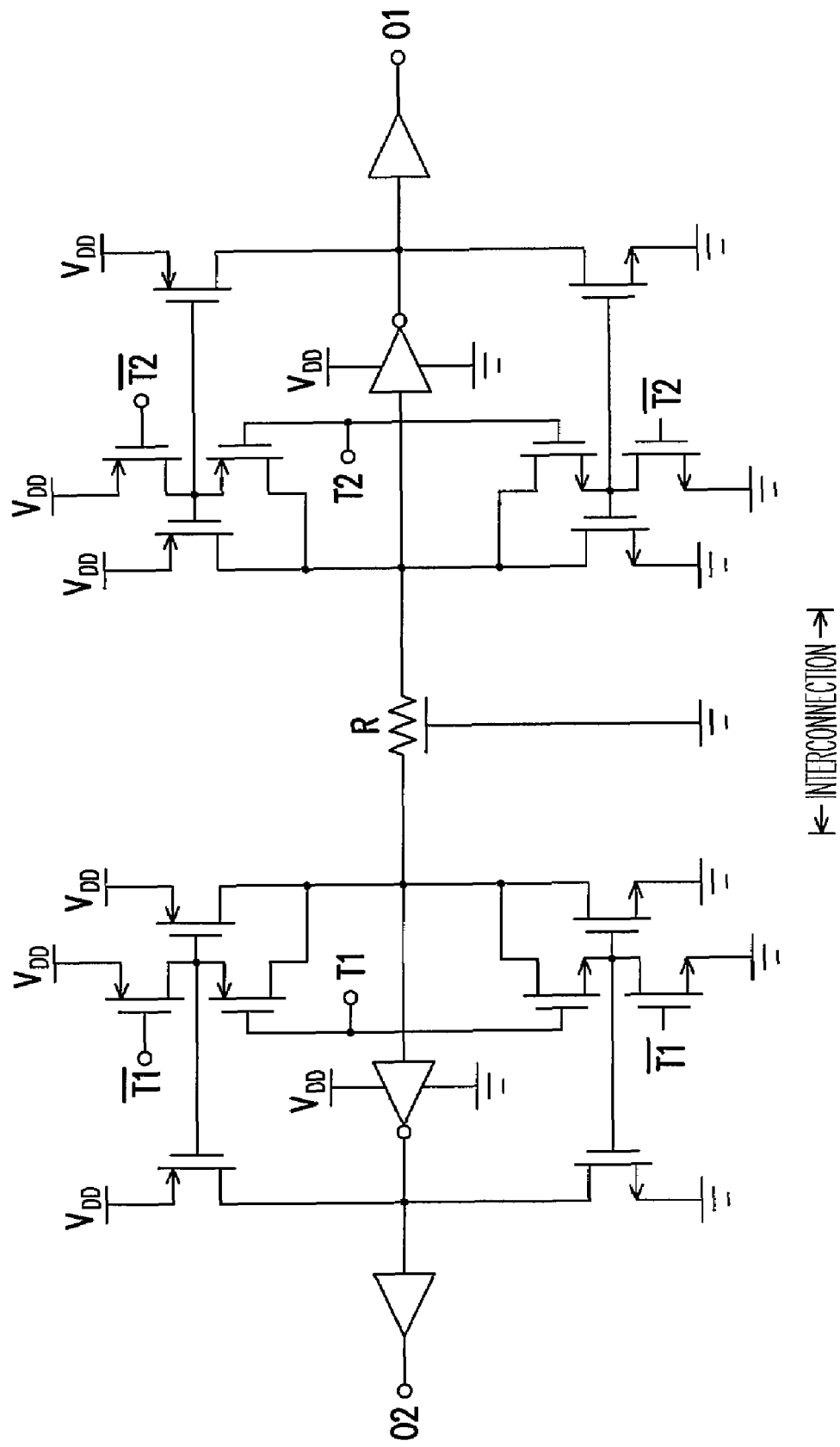
FIG. 5 is a schematic view of a switch-in-gate bidirectional signal transceiver architecture where diode-connected-current-sources are employed.
Figure 6:
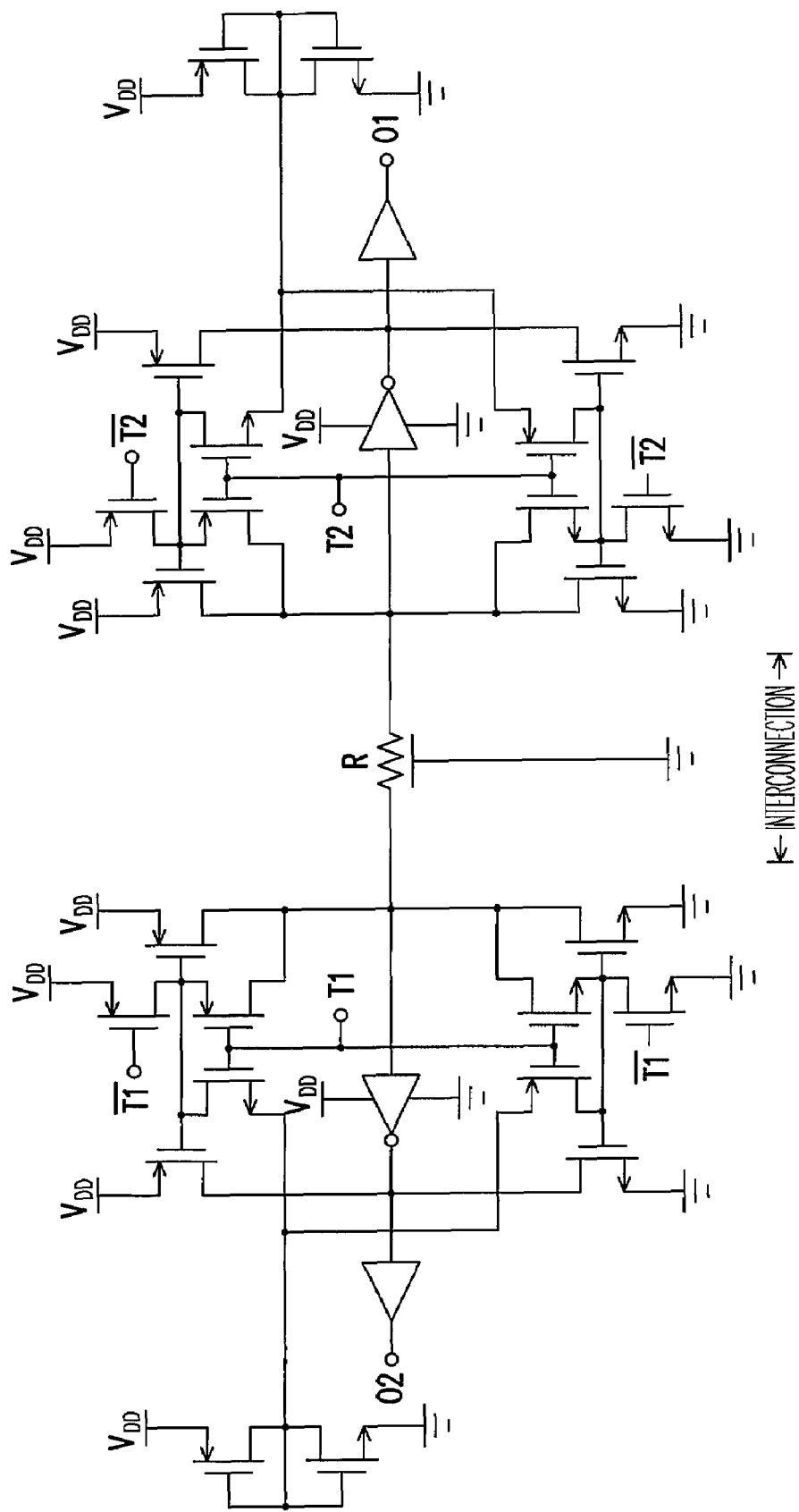
FIG. 6 is a schematic view of a switch-in-gate bidirectional signal transceiver architecture where the bias voltage of the current sources is set at $\frac{1}{2} V_{DD}$.
Figure 7:
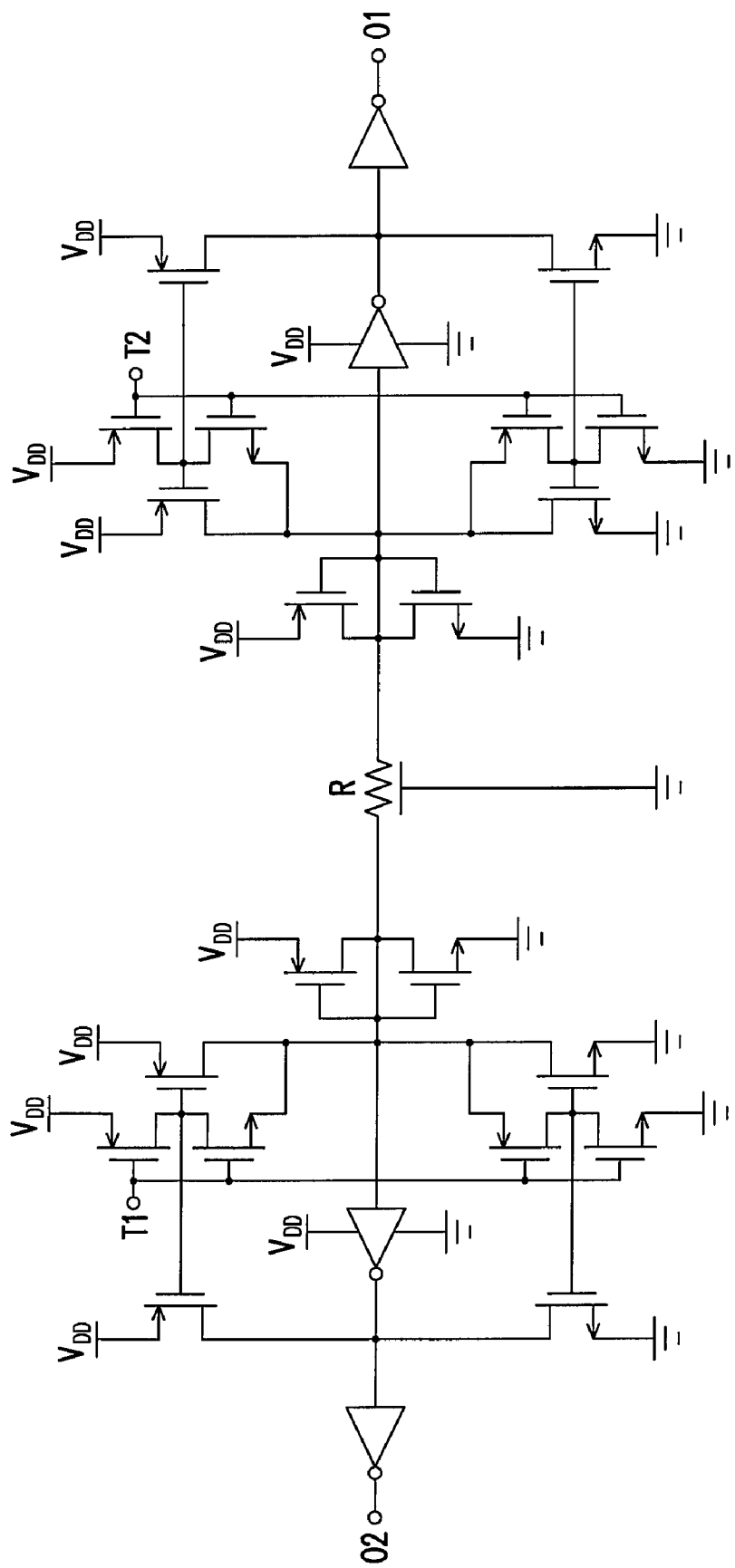
FIG. 7 is a schematic view of a switch-in-gate bidirectional signal transceiver architecture where terminator resistors are adopted.
Figure 10A:
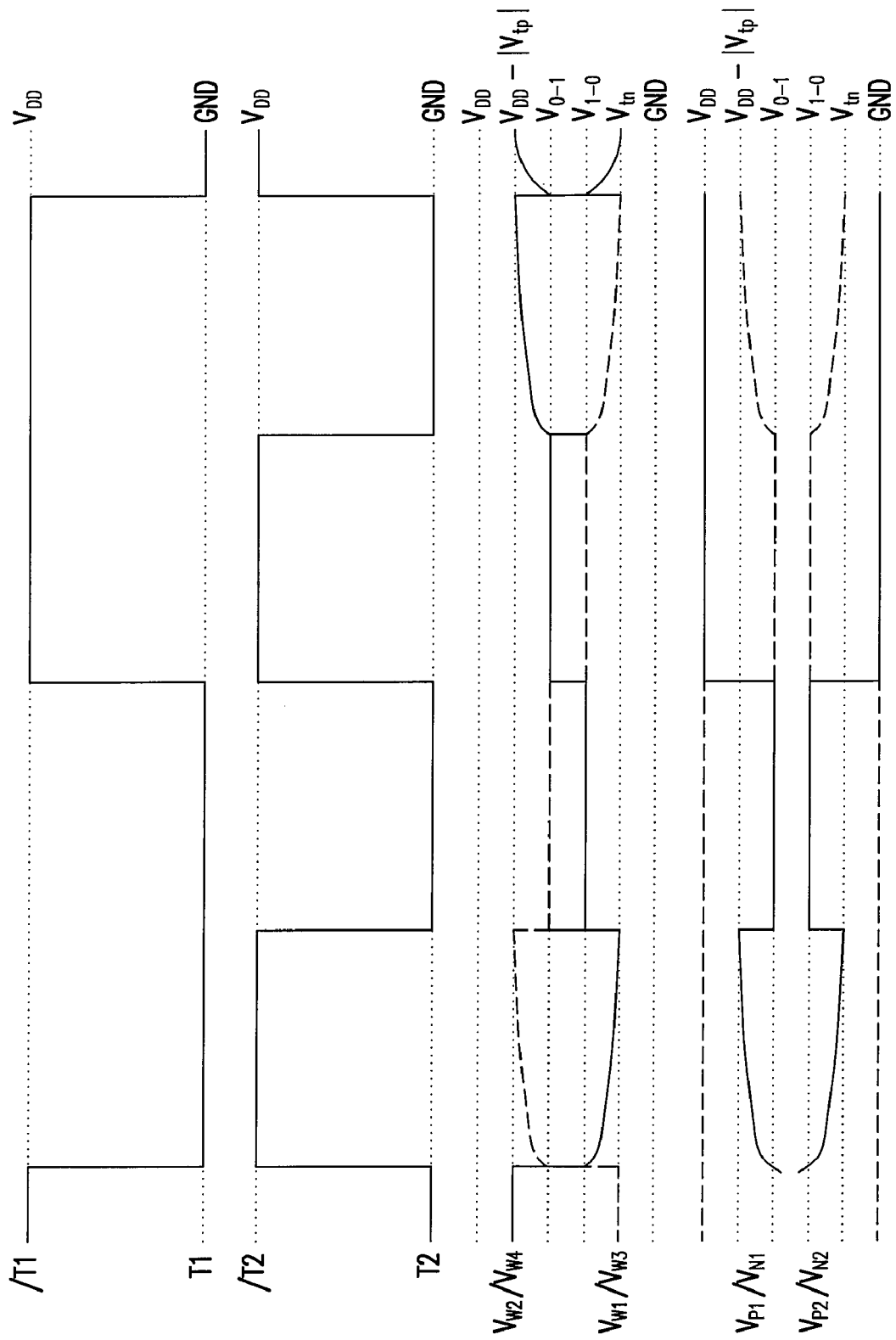
FIG. 10A is a diagram showing the ideal signal waveforms of the circuit architectures in FIG. 9.

FIG. 10A is a diagram showing the ideal signal waveforms of the circuit architectures in FIG. 9 and FIG. 10B is a table showing the bias voltages at the different locations in the circuits of FIG. 9 corresponding to four ideal input voltage states, wherein similarly to FIG. 3B, $V_H = V_{DD} - |V_{tp}|$, $V_L = V_{tn}$.

Referring to FIG. 9 again, since the input voltage signals received by the first current transmitter 905 and the second current transmitter 906 invert signals relative to each other, hence, the input voltage signals received by the first current transmitter 908 and the second current transmitter 909 invert signals relative to each other as well. For simplicity, only the first current transmitters 905 and 908 are explained with accompanying FIG. 11 hereinafter.

Figure 11:
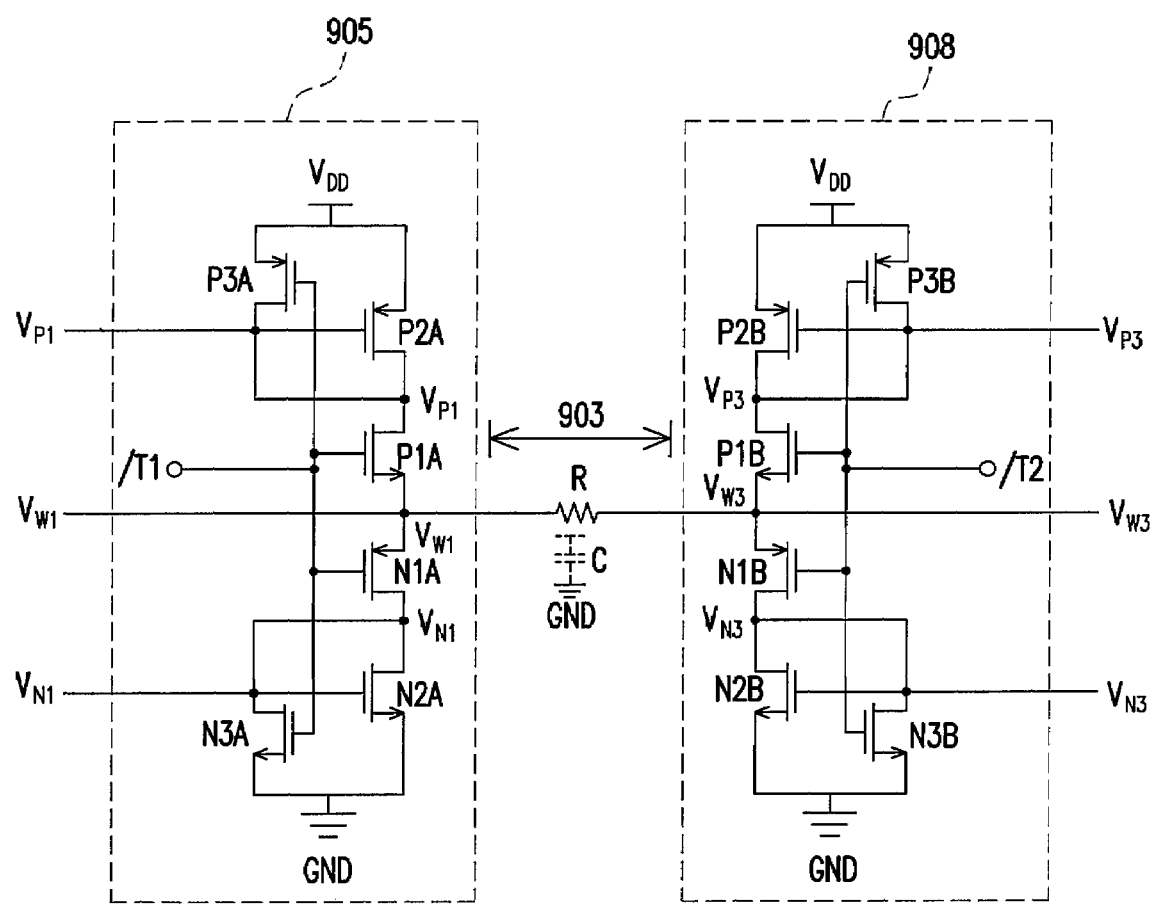
FIG. 11 is a circuit diagram showing the first current transmitters 905 and 908 in FIG. 9 coupled to each other during operations.

FIG. 11 is a circuit diagram showing the first current transmitters 905 and 908 in FIG. 9 are coupled to each other during operations. Referring to FIGS. 10A and 11, the operations of the architecture shown by FIG. 11 corresponding to four signal states are described as follows. First, when both /T1 and /T2 are logic-0 input signals, the transistors N1A and N1B are turned on, while the transistors P1A and P1B are turned off. The signals $V_{W1}$ and $V_{W2}$ on the interconnection 903 would be pulled to $V_{tn}$ respectively by the transistors N2A and N2B, and the interconnection 903 has no current at the point. Since no current flows through the transistor P1A, the level of $V_{P1}$ would be pulled to $V_{DD} - |V_{tp}|$, while $V_{N1}$ would be pulled down to $V_{tn}$. The voltages of the nodes are expressed by the following equations (1)-(6):

$$V_{W1} = V_{DS,N1A} + V_{GS,N2A} = V_{tn} \quad (1)$$

$$V_{W3} = V_{DS,N1B} + V_{GS,N2B} = V_{tn} \quad (2)$$

$$V_{P1} = V_{DD} \quad (3)$$

$$V_{N1} = V_{GS,N2A} \leq V_{tn} \quad (4)$$

$$V_{P3} = V_{DD} \quad (5)$$

$$V_{N3} = V_{GS,N2B} \leq V_{tn} \quad (6)$$

In the equation (1), $V_{DS,N1A}$ represents the voltage difference between the drain of the transistor N1A and the source thereof and $V_{GS,N2A}$ represents the voltage difference between the gate of the transistor N2A and the source thereof, and analogically for the remaining equations and the following equations.

Secondly, when /T1 and /T2 respectively take logic-0 and logic-1, both the transistors N1A and P1B are on, while the transistors P1A and N1B are off. At the point, the node voltage $V_{W1}$ of the interconnection 903 is pulled to the $V_{1-0}$, wherein $V_{1-0}$ indicates a level greater than $V_{tn}$ but less than ½ $V_{DD}$; the node voltage $V_{W3}$ of the is pulled to the $V_{0-1}$, wherein $V_{0-1}$ indicates a level less than $V_{DD} - |V_{tp}|$ but greater than ½ $V_{DD}$. Meanwhile, a current flows through the transistor P1B to the transistor N1A. The voltages of the nodes are expressed by the following equations (7)-(13):

$$V_{W3} = V_{0-1} = V_{DD} - \sqrt{\frac{2I}{k'_p \left(\frac{W}{L}\right)_{P2B}}} - |V_{tp}| - V_{SD,P1B} \quad (7)$$

$$V_{W1} = V_{1-0} = \sqrt{\frac{2I}{k'_n \left(\frac{W}{L}\right)_{N2A}}} + V_{tn} + V_{DS,N1A} \quad (8)$$

$$V_{0-1} - V_{1-0} = IR = V_{DD} - \sqrt{\frac{2I}{k'_p \left(\frac{W}{L}\right)_{P2B}}} - \sqrt{\frac{2I}{k'_n \left(\frac{W}{L}\right)_{N2A}}} - |V_{tp}| - V_{tn} - V_{SD,P1B} - V_{DS,N1A} \quad (9)$$

$$V_{P1} = V_{DD} \quad (10)$$

$$V_{N1} = V_{GS,N2A} = V_{1-0} - V_{DS,N1A} \quad (11)$$

$$V_{P3} = V_{DD} - V_{SG,P2B} = V_{0-1} + V_{SD,P1B} \quad (12)$$

$$V_{N3} = GND \quad (13)$$

Third, when /T1 and /T2 respectively take logic-1 and logic-0, the transistors P1A and N1B are turned on, while the transistors N1A and P1B are turned off. At this point, the node voltage $V_{W1}$ of the interconnection 903 is pulled to the level of $V_{0-1}$, while the node voltage $V_{W3}$ of the interconnection 903 is pulled to the level of $V_{1-0}$. Meanwhile, a current flows to the transistor N1B via the transistor P1A. The voltages of the nodes are expressed by the following equations (14)-(18):

$$V_{W1} - V_{0-1} = V_{DD} - \sqrt{\frac{2I}{k'_p \left(\frac{W}{L}\right)_{P2A}}} - |V_{tp}| - V_{SD,P1A} \quad (14)$$

$$V_{W3} = V_{1-0} = \sqrt{\frac{2I}{k'_n \left(\frac{W}{L}\right)_{N2B}}} + V_{tn} + V_{DS,N1B} \quad (15)$$

$$V_{0-1} - V_{1-0} = IR = V_{DD} - \sqrt{\frac{2I}{k'_p \left(\frac{W}{L}\right)_{P2A}}} - \sqrt{\frac{2I}{k'_n \left(\frac{W}{L}\right)_{N2B}}} - |V_{tp}| - V_{tn} - V_{SD,P1A} - V_{DS,N1B} \quad (16)$$

$$V_{N1} = GND \quad (17)$$

$$V_{P3} = V_{DD} \quad (18)$$

$$V_{N3} = V_{GS,N2B} = V_{1-0} - V_{DS,N1B} \quad (19)$$

Fourth, when both /T1 and /T2 receive logic-1 input signals, the transistors P1A and P1B are turned on, while the transistors N1A and N1B are turned off. At this point, the node voltages $V_{W1}$ and $V_{W3}$ of the interconnection 903 are pulled by the transistors P2A and P2B to the level $V_{DD} - |V_{tp}|$, and no current flows through the interconnection 903. Further, no current flows through the transistor N1A, hence, the levels of $V_{N1}$ and $V_{P1}$ are respectively pulled to $V_{tn}$ and $V_{DD}-|V_{tp}|$. The voltages of the nodes are expressed by the following equations (20)-(25):

$$V_{W1}=V_{DS,P1A}+V_{GS,P2A}=|V_{tp}| \qquad (20)$$

$$V_{W3}=V_{DS,P1B}+V_{GS,P2B}=|V_{tp}| \qquad (21)$$

$$V_{P1}=V_{DD}-V_{SG,P2A} \leqq |V_{tp}| \qquad (22)$$

$$V_{N1}=GND \qquad (23)$$

$$V_{P3}=V_{DD}-V_{SG,P2B} \leqq |V_{tp}| \qquad (24)$$

$$V_{N3}=GND \qquad (25)$$

It can be seen from the above-described operations that if /T1 and /T2 take different logic states of the input signals, the flowing direction of the current and the node voltages $V_{W1}$ and $V_{W3}$ would be changed accordingly. Since the drains of the transistors P2A, N2A, P2B and N2B are respectively coupled to the gates, thereof diode-connected current sources are formed. The voltages $V_{DS}$ of the above-mentioned current sources and the voltages $V_{DS}$ of the transistors P1A, N1A, P1B and N1B (the transistors serve as the switches herein) affect the voltages $V_{0-1}$ and $V_{1-0}$ to a degree. Besides, the transistors P3A, N3A, P3B and N3B are used to avoid unnecessary power consumption.

In the following, the receiver of the architecture in FIG. 9 is described. Since the operation principles of the differential bidirectional transceivers 901 and 902 are the same, only the receiver 907 in the differential bidirectional transceiver 901 is explained with reference to FIG. 12, wherein for convenience, some of components are denoted in different references (for example, PMOS transistor and NMOS transistor are denoted respectively as MP1 and MN1, etc.).

Figure 12:
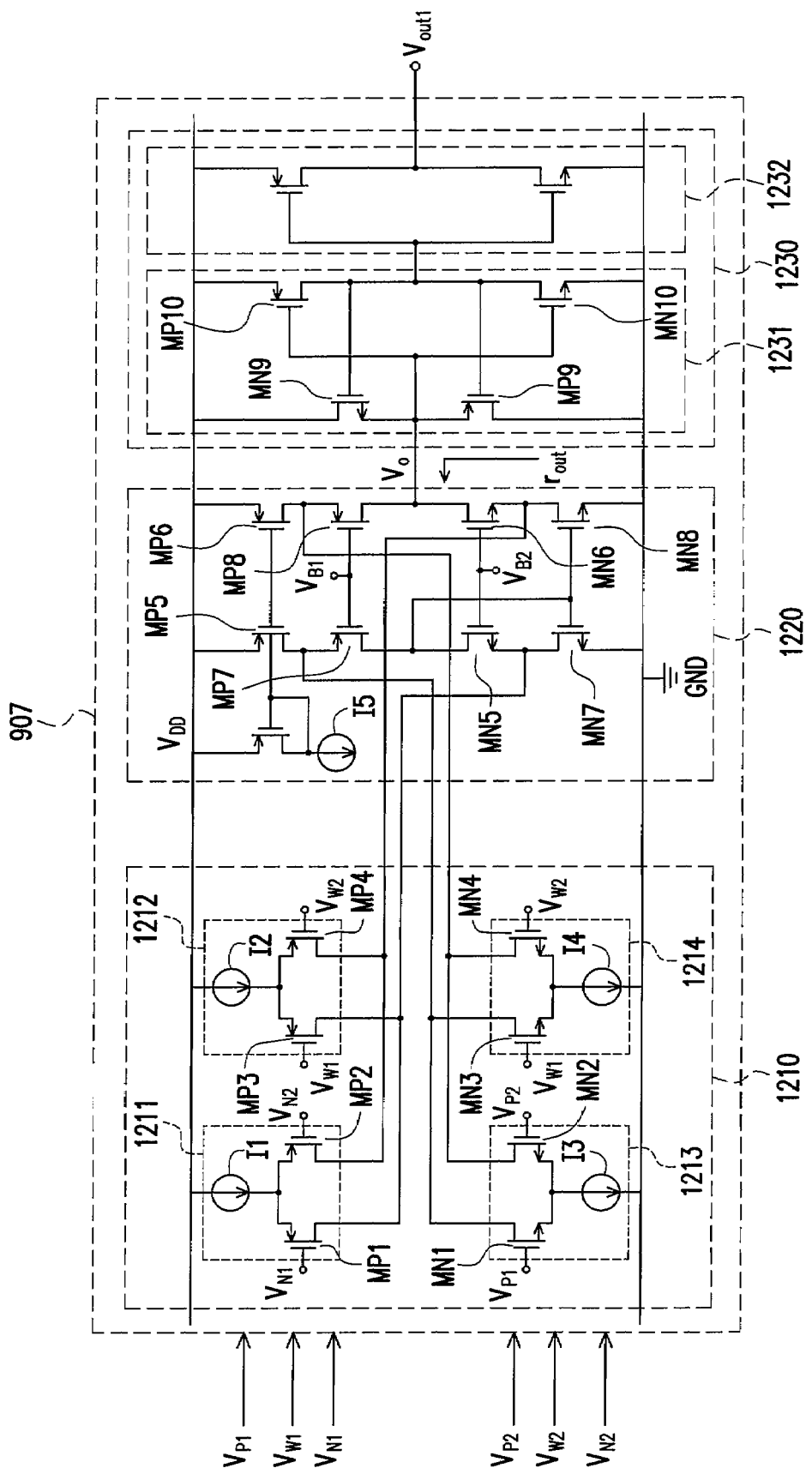
FIG. 12 is a schematic circuit view of the receiver 907 in FIG. 9.

Referring to FIG. 12, the receiver 907 includes an input circuit 1210, a current summation circuit 1220 and a buffer 1230, wherein the input circuit 1210 provides four pairs of differential input signals for respectively comparing the node voltages $V_{N1}$ with $V_{N2}$, the node voltages $V_{P1}$ with $V_{P2}$ and the node voltages $V_{W1}$ with $V_{W2}$, so that the rail-to-rail characteristic is achieved. Each of the differential pairs (as shown by 1211-1214) in the input circuit 1210 has a current source (as shown by I1-I4) to provide the transistors with a bias voltage, wherein the rated currents of the current sources I1 and I3 are the same and the rated currents of the current sources I2 and I4 are the same. When the input signals of the differential pairs are given, i.e. $|V_{W12}|<|V_{P12}|=|V_{N12}|$, the value of the current source I1 would be less than the value of the current source I2 and the value of the current source I3 would be less than the value of the current source I4.

Basically, the current summation circuit 1220 is a transimpedance amplifier for summing up the output currents of the input circuit 1210. The buffer 1230 is for stabilizing trans-conductance denoted by gm and suppressing the small-signal output voltage signal $V_o$ output from the current summation circuit 1220 to ½ $V_{DD}$ or so.

Figure 13:
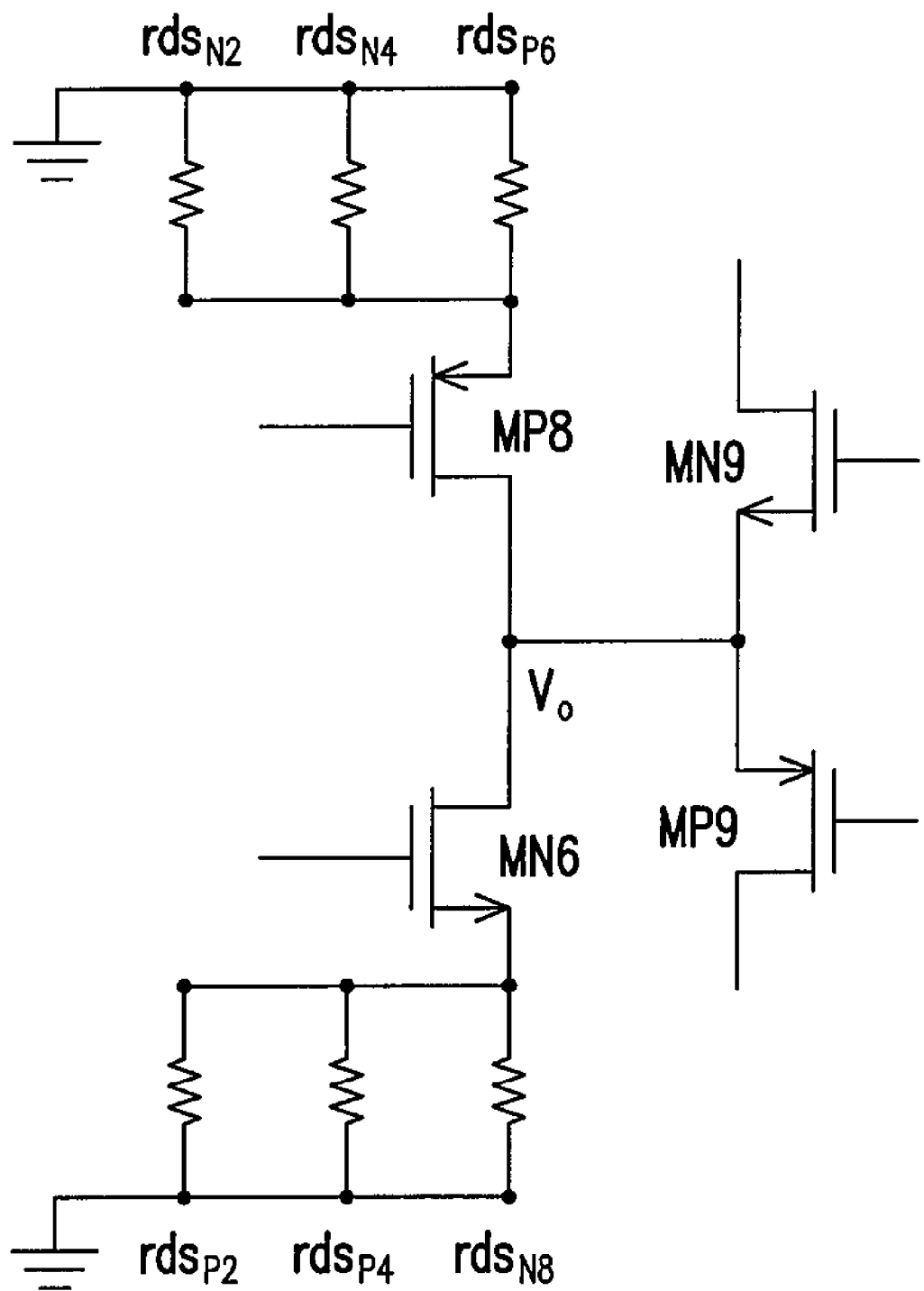
FIG. 13 is the equivalent circuit of the current summation circuit 1220 in FIG. 12, which shows up the small signal model of the current summation circuit.

The input circuit 1210 initially takes a common mode structure, thus, the output resistance at the output terminal of the current summation circuit 1220 (i.e. the node to output the small-signal output voltage signal $V_o$) can be calculated by:

$$r_{out}=[gm_{P8} \cdot rds_{P8} \cdot (rds_{P6}||rds_{N4}||rds_{N2})]||[gm_{N6} \cdot rds_{N6} \cdot (rds_{N8}||rds_{P4}||rds_{P2})]||(1/gm_{P9})||(1/gm_{N9}) \qquad (26)$$

where $gm_{ps}$ represents the transconductance of the transistor MP8 and $rds_{ps}$ represents the resistance between the drain and the source of the transistor MP8, analogically for the rest. At this point, the output terminal of the current summation circuit 1220 demonstrates a small signal model, as shown by FIG. 13; in fact, it is also counted as an equivalent circuit where the input circuit 1210 is considered.

The total transconductance $gm_{total}$ measured at the output terminal of the current summation circuit 1220 is:

$$gm_{total}=gm_{P1}+gm_{P3}+gm_{N1}+gm_{N3} \qquad (27)$$

the voltage gain $A_v$ contributed by the input circuit 1210 and the current summation circuit 1220 can be expressed by:

$$A_v=gm_{total} \cdot r_{out} \qquad (28)$$

and the voltage $v_{out}$ at the output terminal of the current summation circuit 1220 can be expressed by:

$$v_{out}=r_{out} \cdot i_{out} \qquad (29)$$

$$\text{where } i_{out}=i_P+i_N+i_{W1}+i_{W2} \qquad (30)$$

$$\text{and } i_P=i_N=gm_X(v_{P12}), \text{ and } i_{W1}=i_{W2}=gm_Y(v_{W12}) \qquad (31)$$

by substituting equation (31) into equation (30), the output current is obtained:

$$i_{out}=(2gm_X v_{X12})+(2gm_Y v_{W12}) \qquad (32)$$

where $gm_{P1}=gm_{P2}=gm_{N1}=gm_{N2}=gm_X$, $gm_{P3}=gm_{P4}=gm_{N3}=gm_{N4}=gm_Y$ $v_{P12}=v_{N12}=v_{X12}$.

The buffer 1230 includes a first buffer stage 1231 and a second buffer stage 1232. The first buffer stage 1231 is basically composed of transistors MN9 and MP9 served as current sources herein and an inverter formed by transistors MP10 and MN10. When the output of the first buffer stage 1231 falls between the two logic levels, none of the transistors MN9 and MP9 is turned on to produce a high-impedance input; therefore, the transistors MN9 and MP9 are able to automatically suppress the transconductance value.

The differential input signals (i.e. the input voltage signals T1 and /T1 and the input voltage signals T2 and /T2) are employed for providing appropriate input signal levels to replace the small signals, wherein the input signal levels may be the same high as the level of the power voltage $V_{DD}$ or the same low as the common voltage level GND to switch the on/off states of the transistors in the input circuit 1210 and change the trans-conductance value. FIG. 14 is a table of calculating the output resistance $r_{out}$, the total trans-conductance $gm_{total}$ and the output current $i_{out}$ corresponding to four ideal states of the input voltage signals T1 and T2.

Referring to FIG. 14, when the input voltage signals take the state 1, the transistors MN2, MN3, MP1 and MP4 are off, the output resistance $r_{out}$ and the total trans-conductance $gm_{total}$ are given by FIG. 14, while the output current $i_{out}$ can be obtained by the equation (32):

$$i_{out}=gm_{N1}(v_{P12})+gm_{P3}(v_{W12}) \qquad (33)$$

considering $v_{P12}<|-v_{W12}|$ and $gm_{N1}<gm_{P3}$ in the equation (33), the output current can be calculated by:

$$i_{out}=gm_{N1}(v_{P12})-gm_{P3}(|v_{W12}|)<0 \qquad (34)$$

wherein the output current $i_{out}$ is negative due to $v_{W12}$, thus the absolute value thereof is greater than $v_{P12}$.

When the input voltage signals take the state 2, the transistors MN2 and MP1 are off, the output resistance $r_{out}$ and the total trans-conductance $gm_{total}$ at the point are given by FIG. 14, while the output current $i_{out}$ can be obtained by the equation (32):

$$i_{out}=gm_{N1}(v_{P12})+gm_{N3}(v_{W12})+gm_{P3}(v_{W12}) \qquad (35)$$

considering $v_{P12}>0$, $v_{W12}<0$, $v_{P12}>|v_{W12}|$ and $gm_{N1} \approx gm_{N3}+gm_{P3}$ in the equation (35), the output current can be calculated by:

$$i_{out}=gm_{N1}(v_{P12})-gm_{P3}(|v_{W12}|)<0 \qquad (36)$$

Similarly, the operations of the states 3 and 4 are respectively the same as the states 2 and 1 except the operations thereof are complemented to each other. In the state 3, the transistors MN1 and MP2 are off, while in the state 4, the transistors MN1, MN4, MP2 and MP3 are off.

It is obvious when the output current $i_{out}>0$, the output current $i_{out}$ functions to charge the output node; when the output current $i_{out}<0$, the output current $i_{out}$ functions to discharge the output node. Hence, by judging whether the output current $i_{out}$ is greater than 0 or less than 0, it can be decided the signal transmitted by another differential bidirectional transceiver 902 is logic-0 or logic-1.

Figure 15:
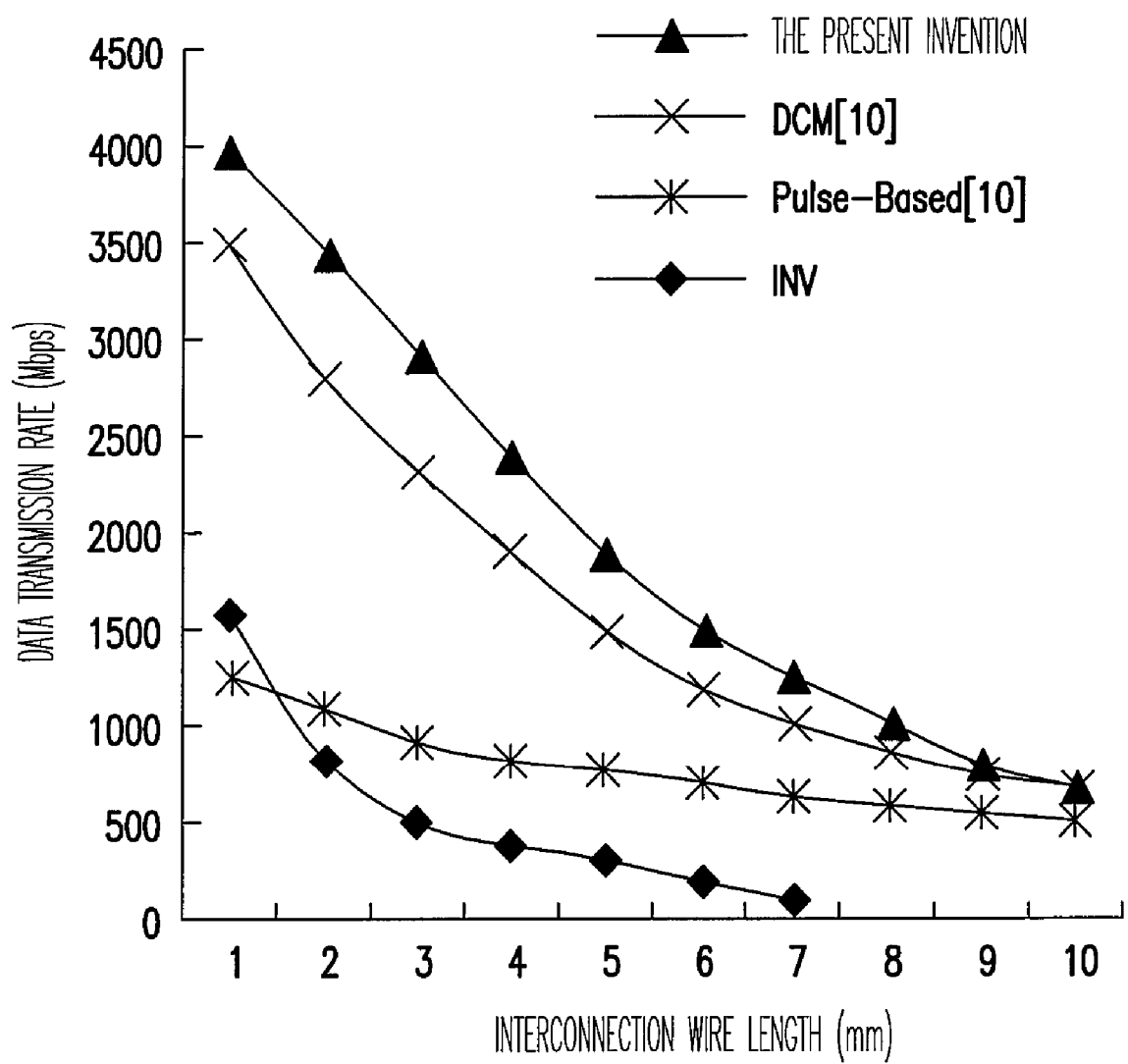
FIG. 15 is a diagram of the highest data transmission rates for different interconnection wire lengths to compare the present invention with the prior art.

FIG. 15 is a diagram of the highest data transmission rates for different interconnection wire lengths to compare the present invention with the prior art. It is obvious that the signal transmission architecture of the present invention has higher data transmission rate.

In summary, since the present invention adopts the differential signal transmission architecture, the noise influence on the circuit can be effectively reduced. Meanwhile, by using a high-gain and high-bandwidth differential amplifier, the voltage swing on the interconnection of the circuit and the power consumption can be further reduced. In addition, the differential signal transmission architecture is able to increase the tolerance standing signal attenuation, so as to perform transmitting and receiving signal operations with a longer interconnection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential bidirectional transceiver, connected to a first interconnection and a second interconnection, comprising:
    a first current transmitter, coupled to the first interconnection, wherein a node of the first current transmitter and the first interconnection has a first wire voltage signal, and the first current transmitter comprises:
        a first current source, having a current terminal, comprising a first internal voltage signal;
        a first switch, coupled to the first current source and the first interconnection, for receiving an inverting signal of an input voltage signal and controlling a current provided by the first current source to flow to the first interconnection according to the inverting signal of the input voltage signal;
        a second current source, having a current terminal, comprising a second internal voltage signal; and
        a second switch, coupled to the second current source and the first interconnection, for receiving the inverting signal of the input voltage signal and controlling a current provided by the second current source to flow from the first interconnection according to the inverting signal of the input voltage signal;
    a second current transmitter, coupled to the second interconnection, wherein a node of the second current transmitter and the second interconnection has a second wire voltage signal, and the second current transmitter comprises:
        a third current source, having a current terminal, comprising a third internal voltage signal;
        a third switch, coupled to the third current source and the second interconnection, for receiving the input voltage signal and controlling a current provided by the third current source to flow to the second interconnection according to the input voltage signal;
        a fourth current source, having a current terminal, comprising a fourth internal voltage signal; and
        a fourth switch, coupled to the fourth current source and the second interconnection, for receiving the input voltage signal and controlling a current provided by the fourth current source to flow from the second interconnection according to the input voltage signal; and
    a receiver, comprising:
        an input circuit, comprising:
            a first differential pair, for comparing the second internal voltage signal with the fourth internal voltage signal;
            a second differential pair, for comparing the first wire voltage signal with the second wire voltage signal;
            a third differential pair, for comparing the first internal voltage signal with the third internal voltage signal; and
            a fourth differential pair, for comparing the first wire voltage signal with the second wire voltage signal;
        a current summation circuit, coupled to the input circuit for summing up the output currents of the differential pairs and obtaining a small-signal output voltage signal according to the comparison result of the differential pairs; and
        a buffer, coupled to the current summation circuit, for adjusting the small-signal output voltage signal output from the current summation circuit.

2. The differential bidirectional transceiver according to claim 1, wherein the first current source comprises a PMOS transistor, a source of the PMOS transistor is coupled to a power voltage and the drain of the PMOS transistor serving as a current terminal of the first current source and coupled to the gate of the PMOS transistor.

3. The differential bidirectional transceiver according to claim 2, wherein the first switch comprises an NMOS transistor, a drain of the NMOS transistor is coupled to the current terminal of the first current source, the source of the NMOS transistor is coupled to the first interconnection and a gate of the NMOS transistor receives the inverting signal of the input voltage signal to control on/off states of the first switch according to the inverting signal of the input voltage signal.

4. The differential bidirectional transceiver according to claim 3, wherein the second current source comprises an NMOS transistor, a source of the NMOS transistor is coupled to a common voltage level and a drain of the NMOS transistor is served as the current terminal of the second current source and coupled to a gate of the NMOS transistor.

5. The differential bidirectional transceiver according to claim 4, wherein the second switch comprises a PMOS transistor, a drain of the PMOS transistor is coupled to the current terminal of the second current source, a source of the PMOS transistor is coupled to the first interconnection and a gate of the PMOS transistor receives the inverting signal of the input voltage signal to control on/off states of the second switch according to the inverting signal of the input voltage signal.

6. The differential bidirectional transceiver according to claim 5, wherein the first current transmitter further comprises a fifth switch coupled between the current terminal of the first current source and the power voltage for controlling on/off states of the fifth switch according to the inverting signal of the input voltage signal.

7. The differential bidirectional transceiver according to claim 6, wherein the fifth switch comprises a PMOS transistor, the source of the PMOS transistor is coupled to the power voltage, a drain of the PMOS transistor is coupled to a current terminal of the first current source and a gate of the PMOS transistor receives an inverting signal of the input voltage signal to control on/off states of the fifth switch according to the inverting signal of the input voltage signal.

8. The differential bidirectional transceiver according to claim 6, wherein the first current transmitter further comprises a sixth switch coupled between the current terminal of the second current source and the common voltage level for controlling on/off states of the sixth switch according to an inverting signal of the input voltage signal.

9. The differential bidirectional transceiver according to claim 8, wherein the sixth switch comprises an NMOS transistor, a source of the NMOS transistor is coupled to the common voltage level, a drain of the NMOS transistor is coupled to the current terminal of the second current source and a gate of the NMOS transistor receives the inverting signal of the input voltage signal to control on/off states of the sixth switch according to the inverting signal of the input voltage signal.

10. The differential bidirectional transceiver according to claim 1, wherein the third current source comprises a PMOS transistor, a source of the PMOS transistor is coupled to a power voltage and a drain of the PMOS transistor serves as a current terminal of the third current source and coupled to a gate of the PMOS transistor.

11. The differential bidirectional transceiver according to claim 10, wherein the third switch comprises an NMOS transistor, a drain of the NMOS transistor is coupled to the current terminal of the third current source, a source of the NMOS transistor is coupled to the second interconnection and a gate of the NMOS transistor receives the input voltage signal to control on/off states of the third switch according to the input voltage signal.

12. The differential bidirectional transceiver according to claim 11, wherein the fourth current source comprises an NMOS transistor, a source of the NMOS transistor is coupled to a common voltage level and a drain of the NMOS transistor serving as a current terminal of the fourth current source and coupled to a gate of the NMOS transistor.

13. The differential bidirectional transceiver according to claim 12, wherein the fourth switch comprises a PMOS transistor, a drain of the PMOS transistor is coupled to the current terminal of the fourth current source, a source of the PMOS transistor is coupled to the second interconnection and a gate of the PMOS transistor receives the input voltage signal to control on/off states of the fourth switch according to the input voltage signal.

14. The differential bidirectional transceiver according to claim 13, wherein the second current transmitter further comprises a seventh switch coupled between the current terminal of the third current source and the power voltage for controlling on/off states of the seventh switch according to the input voltage signal.

15. The differential bidirectional transceiver according to claim 14, wherein the seventh switch comprises a PMOS transistor, a source of the PMOS transistor is coupled to the power voltage, a drain of the PMOS transistor is coupled to a current terminal of the third current source and a gate of the PMOS transistor receives the input voltage signal to control on/off states of the seventh switch according to the input voltage signal.

16. The differential bidirectional transceiver according to claim 14, wherein the second current transmitter further comprises an eighth switch coupled between the current terminal of the fourth current source and the common voltage level for controlling on/off states of the eighth switch according to the input voltage signal.

17. The differential bidirectional transceiver according to claim 16, wherein the eighth switch comprises an NMOS transistor, a source of the NMOS transistor is coupled to the common voltage level, a drain of the NMOS transistor is coupled to the current terminal of the fourth current source and a gate of the NMOS transistor receives the input voltage signal to control on/off states of the eighth switch according to the input voltage signal.

18. The differential bidirectional transceiver according to claim 1, wherein the first differential pair comprises:
 a fifth current source, having a first terminal and a second terminal, wherein the first terminal of the fifth current source is coupled to a power voltage;
 a first PMOS transistor, wherein a source of the first PMOS transistor is coupled to the second terminal of the fifth current source, a drain of the first PMOS transistor is coupled to a first current output terminal of the input circuit and a gate of the first PMOS transistor receives the second internal voltage signal; and
 a second PMOS transistor, wherein a source of the second PMOS transistor is coupled to the second terminal of the fifth current source, a drain of the second PMOS transistor is coupled to a second current output terminal of the input circuit and a gate of the second PMOS transistor receives the fourth internal voltage signal.

19. The differential bidirectional transceiver according to claim 18, wherein the second differential pair comprises:
 a sixth current source, having a first terminal and a second terminal, wherein the first terminal of the sixth current source is coupled to the power voltage;
 a third PMOS transistor, wherein a source of the third PMOS transistor is coupled to the second terminal of the sixth current source, a drain of the third PMOS transistor is coupled to the first current output terminal and a gate of the third PMOS transistor receives the first wire voltage signal; and
 a fourth PMOS transistor, wherein a source of the fourth PMOS transistor is coupled to the second terminal of the sixth current source, a drain of the fourth PMOS transistor is coupled to the second current output terminal and a gate of the fourth PMOS transistor receives the second wire voltage signal.

20. The differential bidirectional transceiver according to claim 19, wherein the third differential pair comprises:
 a seventh current source, having a first terminal and a second terminal, wherein the first terminal of the seventh current source is coupled to a common voltage level;
 a first NMOS transistor, wherein a source of the first NMOS transistor is coupled to the second terminal of the seventh current source, a drain of the first NMOS transistor is coupled to a third current output terminal of the input circuit and a gate of the first NMOS transistor receives the first internal voltage signal; and
 a second NMOS transistor, wherein a source of the second NMOS transistor is coupled to the second terminal of the seventh current source, a drain of the second NMOS transistor is coupled to a fourth current output terminal of the input circuit and a gate of the second NMOS transistor receives the third internal voltage signal,
wherein rated output currents of the seventh current source and the fifth current source are the same.

21. The differential bidirectional transceiver according to claim 20, wherein the fourth differential pair comprises:
   an eighth current source, having a first terminal and a second terminal, wherein the first terminal of the eighth current source is coupled to the common voltage level;
   a third NMOS transistor, wherein a source of the third NMOS transistor is coupled to the second terminal of the eighth current source, a drain of the third NMOS transistor is coupled to the third current output terminal and a gate of the third NMOS transistor receives the first wire voltage signal; and
   a fourth NMOS transistor, wherein a source of the fourth NMOS transistor is coupled to the second terminal of the eighth current source, a drain of the fourth NMOS transistor is coupled to the fourth current output terminal and a gate of the fourth NMOS transistor receives the second wire voltage signal,
   wherein rated output currents of the eighth current source and the sixth current source are the same.

22. The differential bidirectional transceiver according to claim 21, wherein the current summation circuit comprises:
   a ninth current source;
   a fifth PMOS transistor, wherein a source of the fifth PMOS transistor is coupled to the power voltage and a drain of the fifth PMOS transistor is coupled to the ninth current source and a gate of the fifth PMOS transistor;
   a sixth PMOS transistor, wherein a source of the sixth PMOS transistor is coupled to the power voltage and a gate of the sixth PMOS transistor is coupled to the gate of the fifth PMOS transistor;
   a seventh PMOS transistor, wherein a source of the seventh PMOS transistor is coupled to the power voltage and a gate of the seventh PMOS transistor is coupled to the gate of the sixth PMOS transistor;
   an eighth PMOS transistor, wherein a source of the eighth PMOS transistor is coupled to the drain of the sixth PMOS transistor and the third current output terminal of the input circuit and a gate of the eighth PMOS transistor receives a first bias voltage signal;
   a ninth PMOS transistor, wherein a source of the ninth PMOS transistor is coupled to the drain of the seventh PMOS transistor and a fourth current output terminal of the input circuit and a gate of the ninth PMOS transistor receives the first bias voltage signal;
   a fifth NMOS transistor, wherein a drain of the fifth NMOS transistor is coupled to the drain of the eighth PMOS transistor and a gate of the fifth NMOS transistor receives a second bias voltage signal;
   a sixth NMOS transistor, wherein a drain of the sixth NMOS transistor is coupled to the drain of the ninth PMOS transistor for outputting the small-signal output voltage signal and a gate of the sixth NMOS transistor receives the second bias voltage signal;
   a seventh NMOS transistor, wherein a drain of the seventh NMOS transistor is coupled to the source of the fifth NMOS transistor and the first current output terminal of the input circuit, a gate of the seventh NMOS transistor is coupled to the drain of the eighth PMOS transistor and a source of the seventh NMOS transistor is coupled to the common voltage level; and
   an eighth NMOS transistor, wherein a drain of the eighth NMOS transistor is coupled to the source of the sixth NMOS transistor and the second current output terminal of the input circuit, a gate of the eighth NMOS transistor is coupled to the gate of the seventh NMOS transistor and a source of the eighth NMOS transistor is coupled to the common voltage level.

23. The differential bidirectional transceiver according to claim 1, wherein the buffer comprises:
   a first buffer stage, coupled to an output terminal of the current summation circuit, wherein the output terminal outputs the small-signal output voltage signal and the first buffer stage is for inverting the small-signal output voltage signal and stabilizing voltage at the output terminal of the current summation circuit; and
   a second buffer stage, coupled to the first buffer stage for inverting the output of the first buffer stage.

24. The differential bidirectional transceiver according to claim 23, wherein the first buffer stage comprises:
   a ninth NMOS transistor, wherein a drain of the ninth NMOS transistor is coupled to a power voltage and a source of the ninth NMOS transistor is coupled to the output terminal of the current summation circuit;
   a tenth PMOS transistor, wherein a drain of the tenth PMOS transistor is coupled to a common voltage level and a source of the tenth PMOS transistor is coupled to the output terminal of the current summation circuit;
   an eleventh PMOS transistor, wherein a source of the eleventh PMOS transistor is coupled to the power voltage, a drain of the eleventh PMOS transistor is coupled to the gate of the ninth NMOS transistor and a gate of the eleventh PMOS transistor is coupled to the output terminal of the current summation circuit; and
   a tenth NMOS transistor, wherein a source of the tenth NMOS transistor is coupled to the common voltage level, a drain of the tenth NMOS transistor is coupled to the gate of the tenth PMOS transistor and the drain of the eleventh PMOS transistor and a gate of the tenth NMOS transistor is coupled to the output terminal of the current summation circuit.

25. The differential bidirectional transceiver according to claim 24, wherein the second buffer stage comprises:
   a twelfth PMOS transistor, wherein a source of the twelfth PMOS transistor is coupled to the power voltage, a gate of the twelfth PMOS transistor is coupled to the drain of the eleventh PMOS transistor and the drain of the tenth NMOS transistor; and
   an eleventh NMOS transistor, wherein a source of the eleventh NMOS transistor is coupled to the common voltage level, a gate of the eleventh NMOS transistor is coupled to the gate of the twelfth PMOS transistor and a drain of the eleventh NMOS transistor is coupled to the drain of the twelfth PMOS transistor for outputting the adjusted small-signal output voltage signal.

26. A receiver, connected to a first current transmitter, a second current transmitter, a first interconnection and a second interconnection, wherein the first interconnection has a first wire voltage signal, the second interconnection has a second wire voltage signal, the first current transmitter outputs a first internal voltage signal and a second internal voltage signal, and the second current transmitter outputs a third internal voltage signal and a fourth internal voltage signal, the receiver comprising:
   an input circuit, comprising:
      a first differential pair, for comparing the second internal voltage signal with the fourth internal voltage signal;
      a second differential pair, for comparing the first wire voltage signal with the second wire voltage signal;

a third differential pair, for comparing the first internal voltage signal with the third internal voltage signal; and a fourth differential pair, for comparing the first wire voltage signal with the second wire voltage signal;

a current summation circuit, coupled to the input circuit for summing up the output currents of the differential pairs and obtaining a small-signal output voltage signal according to the comparison result of the differential pairs; and a buffer, coupled to the current summation circuit, for adjusting the small-signal output voltage signal output from the current summation circuit.

27. The receiver according to claim 26, wherein the first current transmitter and the second current transmitter are coupled to the first interconnection and the second interconnection respectively, the first current transmitter and the second current transmitter comprises:

a first current source, having a current terminal, comprising the first internal voltage signal;

a first switch, coupled to the first current source and the first interconnection, for receiving an inverting signal of an input voltage signal and controlling a current provided by the first current source to flow to the first interconnection according to the inverting signal of the input voltage signal;

a second current source, having a current terminal, comprising the second internal voltage signal; and a second switch, coupled to the second current source and the first interconnection, for receiving the inverting signal of the input voltage signal and controlling a current provided by the second current source to flow from the first interconnection according to the inverting signal of the input voltage signal;

a third current source, having a current terminal, comprising the third internal voltage signal;

a third switch, coupled to the third current source and the second interconnection, for receiving the input voltage signal and controlling a current provided by the third current source to flow to the second interconnection according to the input voltage signal;

a fourth current source, having a current terminal, comprising the fourth internal voltage signal; and a fourth switch, coupled to the fourth current source and the second interconnection, for receiving the input voltage signal and controlling a current provided by the fourth current source to flow from the second interconnection according to the input voltage signal.

28. The receiver according to claim 26, wherein the first differential pair comprises:

a fifth current source, having a first terminal and a second terminal, wherein the first terminal of the fifth current source is coupled to a power voltage;

a first PMOS transistor, wherein a source of the first PMOS transistor is coupled to the second terminal of the fifth current source, a drain of the first PMOS transistor is coupled to a first current output terminal of the input circuit and a gate of the first PMOS transistor receives the second internal voltage signal; and a second PMOS transistor, wherein a source of the second PMOS transistor is coupled to the second terminal of the fifth current source, a drain of the second PMOS transistor is coupled to a second current output terminal of the input circuit and a gate of the second PMOS transistor receives the fourth internal voltage signal.

29. The receiver according to claim 28, wherein the second differential pair comprises:

a sixth current source, having a first terminal and a second terminal, wherein the first terminal of the sixth current source is coupled to the power voltage;

a third PMOS transistor, wherein a source of the third PMOS transistor is coupled to the second terminal of the sixth current source, a drain of the third PMOS transistor is coupled to the first current output terminal and a gate of the third PMOS transistor receives the first wire voltage signal; and a fourth PMOS transistor, wherein a source of the fourth PMOS transistor is coupled to the second terminal of the sixth current source, a drain of the fourth PMOS transistor is coupled to the second current output terminal and a gate of the fourth PMOS transistor receives the second wire voltage signal.

30. The receiver according to claim 29, wherein the third differential pair comprises:

a seventh current source, having a first terminal and a second terminal, wherein the first terminal of the seventh current source is coupled to a common voltage level;

a first NMOS transistor, wherein a source of the first NMOS transistor is coupled to the second terminal of the seventh current source, a drain of the first NMOS transistor is coupled to a third current output terminal of the input circuit and a gate of the first NMOS transistor receives the first internal voltage signal; and a second NMOS transistor, wherein a source of the second NMOS transistor is coupled to the second terminal of the seventh current source, a drain of the second NMOS transistor is coupled to a fourth current output terminal of the input circuit and a gate of the second NMOS transistor receives the third internal voltage signal, wherein rated output currents of the seventh current source and the fifth current source are the same.

31. The receiver according to claim 30, wherein the fourth differential pair comprises:

an eighth current source, having a first terminal and a second terminal, wherein the first terminal of the eighth current source is coupled to the common voltage level;

a third NMOS transistor, wherein a source of the third NMOS transistor is coupled to the second terminal of the eighth current source, a drain of the third NMOS transistor is coupled to the third current output terminal and a gate of the third NMOS transistor receives the first wire voltage signal; and a fourth NMOS transistor, wherein a source of the fourth NMOS transistor is coupled to the second terminal of the eighth current source, a drain of the fourth NMOS transistor is coupled to the fourth current output terminal and a gate of the fourth NMOS transistor receives the second wire voltage signal, wherein rated output currents of the eighth current source and the sixth current source are the same.

32. The receiver according to claim 31, wherein the current summation circuit comprises:

a ninth current source;

a fifth PMOS transistor, wherein a source of the fifth PMOS transistor is coupled to the power voltage and a drain of the fifth PMOS transistor is coupled to the ninth current source and a gate of the fifth PMOS transistor;

a sixth PMOS transistor, wherein a source of the sixth PMOS transistor is coupled to the power voltage and a gate of the sixth PMOS transistor is coupled to the gate of the fifth PMOS transistor;

a seventh PMOS transistor, wherein a source of the seventh PMOS transistor is coupled to the power voltage and a gate of the seventh PMOS transistor is coupled to the gate of the sixth PMOS transistor;

an eighth PMOS transistor, wherein a source of the eighth PMOS transistor is coupled to the drain of the sixth PMOS transistor and the third current output terminal of the input circuit and a gate of the eighth PMOS transistor receives a first bias voltage signal;

a ninth PMOS transistor, wherein a source of the ninth PMOS transistor is coupled to the drain of the seventh PMOS transistor and the fourth current output terminal of the input circuit and a gate of the ninth PMOS transistor receives the first bias voltage signal;

a fifth NMOS transistor, wherein a drain of the fifth NMOS transistor is coupled to the drain of the eighth PMOS transistor and a gate of the fifth NMOS transistor receives a second bias voltage signal;

a sixth NMOS transistor, wherein a drain of the sixth NMOS transistor is coupled to the drain of the ninth PMOS transistor for outputting the small-signal output voltage signal and a gate of the sixth NMOS transistor receives the second bias voltage signal;

a seventh NMOS transistor, wherein a drain of the seventh NMOS transistor is coupled to the source of the fifth NMOS transistor and the first current output terminal of the input circuit, a gate of the seventh NMOS transistor is coupled to the drain of the eighth PMOS transistor and a source of the seventh NMOS transistor is coupled to the common voltage level; and an eighth NMOS transistor, wherein a drain of the eighth NMOS transistor is coupled to the source of the sixth NMOS transistor and the second current output terminal of the input circuit, a gate of the eighth NMOS transistor is coupled to the gate of the seventh NMOS transistor and a source of the eighth NMOS transistor is coupled to the common voltage level.

33. The receiver according to claim 26, wherein the buffer comprises:

a first buffer stage, coupled to an output terminal of the current summation circuit, wherein the output terminal outputs the small-signal output voltage signal and the first buffer stage is for inverting the small-signal output voltage signal and stabilizing voltage at the output terminal of the current summation circuit; and a second buffer stage, coupled to the first buffer stage for inverting the output of the first buffer stage.

* * * * *